United States Patent
Welte et al.

(10) Patent No.: US 11,355,311 B2
(45) Date of Patent: Jun. 7, 2022

(54) METHOD AND APPARATUS FOR DETERMINING A WAVEFRONT OF A MASSIVE PARTICLE BEAM

(71) Applicant: Carl Zeiss SMT GmbH, Oberkochen (DE)

(72) Inventors: Joachim Welte, Darmstadt (DE); Markus Bauer, Rossdorf (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/832,471

(22) Filed: Mar. 27, 2020

(65) Prior Publication Data

US 2020/0312613 A1   Oct. 1, 2020

(30) Foreign Application Priority Data

Apr. 1, 2019 (DE) .......................... 102019204575.8

(51) Int. Cl.
H01J 37/28 (2006.01)
(52) U.S. Cl.
CPC ......... *H01J 37/28* (2013.01); *H01J 2237/153* (2013.01); *H01J 2237/24507* (2013.01)
(58) Field of Classification Search
CPC .............. H01J 37/28; H01J 2237/153; H01J 2237/24507; H01J 2237/2614; H01J 37/222; H01J 2237/24514; H01J 2237/1534; H01J 37/26; G01T 1/29; G01T 1/2914; G01T 1/2921; G03F 1/86; G21K 1/06
See application file for complete search history.

(56) References Cited

U.S. PATENT DOCUMENTS

| 5,134,288 A | 7/1992 | Van Dijck |
| 2015/0170876 A1* | 6/2015 | Janssen .................. H01J 37/28 250/307 |
| 2016/0305773 A1* | 10/2016 | Farah .................. G03F 7/70408 |
| 2017/0069080 A1 | 3/2017 | Sezginer et al. |

(Continued)

FOREIGN PATENT DOCUMENTS

| CN | 103714516 | 4/2014 | .............. G06T 5/00 |
| JP | H 4-233150 | 8/1992 | .............. H01J 37/26 |

(Continued)

OTHER PUBLICATIONS

The German Office Action for German Application No. DE 10 2019 204 575.8 dated Jun. 28, 2019.
Babin et al., "Technique to automatically measure electron-beam diameter and astigmatism: BEAMETR", *J. Vac. Sci. Technol. B*, vol. 24, No. 6, pp. 2956-2959 (Nov./Dec. 2006).

(Continued)

*Primary Examiner* — David A Vanore
(74) *Attorney, Agent, or Firm* — Fish & Richardson P.C.

(57) ABSTRACT

The present application relates to a method and an apparatus for determining a wavefront of a massive particle beam, including the steps of: (a) recording two or more images of a reference structure using the massive particle beam under different recording conditions; (b) generating point spread functions for the two or more recorded images with a modified reference image of the reference structure; and (c) performing a phase reconstruction of the massive particle beam on the basis of the generated point spread functions and the different recording conditions, for the purposes of determining the wavefront.

20 Claims, 18 Drawing Sheets

(56) References Cited

U.S. PATENT DOCUMENTS

2017/0345615 A1    11/2017  Zotta et al.
2019/0271534 A1*   9/2019   Farah .................. G03F 7/70408
2020/0312613 A1*   10/2020  Welte .................... H01J 37/222

FOREIGN PATENT DOCUMENTS

| JP | H 10-500532 | 1/1998 | ............ H01J 37/295 |
| JP | 2007-200769 | 8/2007 | .............. H01J 37/22 |
| JP | 2010-211973 | 9/2010 | .............. H01J 37/21 |
| JP | 2015-118940 | 6/2015 | .............. H01J 37/22 |
| JP | 2017-146189 | 8/2017 | ............ G01M 11/00 |
| TW | 201719783 | 6/2017 | .............. H01L 21/66 |
| WO | WO 96/28751 | 9/1996 | .............. G02B 21/00 |

OTHER PUBLICATIONS

Barth, et al., "Addition of different contributions to the charged particle probe size," *Optik*, vol. 101, No. 3, p. 101-109 (1996).

Lichte et al., "Electron holography—Basics and applications", *Reports on Progress in Physics*, vol. 71, pp. 016102-1-016102-46 (2007).

The Decision to Grant a Patent issued by the Japanese Patent Office for Application No. JP 2020-065759, dated May 21, 2021 (with English Translation).

The Notice of Examination Opinion issued by the Taiwan Patent Office for Application No. TW 109110822, dated May 26, 2021 (with English Translation).

The Notice of Allowance issued by the Korean Intellectual Property Office for Application No. KR 10-2020-0039779, dated Dec. 23, 2021 (with English Translation).

\* cited by examiner 1920 1910

2350

METHOD AND APPARATUS FOR DETERMINING A WAVEFRONT OF A MASSIVE PARTICLE BEAM

CROSS-REFERENCE TO RELATED APPLICATIONS

The present patent application claims the priority of the German patent application DE 10 2019 204 575.8, which was filed on Apr. 1, 2019 at the German Patent and Trade Mark Office and which, in the entirety thereof, is incorporated by reference in the present application.

TECHNICAL FIELD

The present invention relates to a method and an apparatus for determining a wavefront of a massive particle beam, e.g., of an electron beam.

BACKGROUND

Advances in nanotechnology make it possible to produce components with structure elements becoming smaller and smaller. To process and display the nanostructures, tools that can image these structures are required so that a realistic image of these structures can be generated from measurement data.

Microscopes are potent tools for imaging nanostructures. In microscopes, a particle beam typically interacts with a sample to be analyzed or processed. Microscopes can be subdivided into two categories. Optical or light-optical microscopes use photons to image a sample. This microscope type is used in many different ways to image microscopic structures. The resolution of light-optical microscopes is limited by the wavelength of the light source used to expose the sample to be examined and by the numerical aperture of the optical elements used to image the sample on account of diffraction effects. The production of light sources in the deep ultraviolet wavelength range and, in particular, for even shorter wavelengths is very complicated.

Microscopes that use massive particles for imaging nanostructures, for example electron microscopes, have significant advantages in terms of the resolution over optical microscopes on account of the short de Broglie wavelength of the electrons that are used for imaging purposes. Similar to the case of optical microscopes, the diffraction limit of electron microscopes, for example, scales linearly with the de Broglie wavelength of the electrons and is inversely proportional to the aperture angle of the employed electron beam. Accordingly, the diffraction limit of electron beams can be reduced by virtue of the electrons of an electron beam being accelerated to a greater kinetic energy.

However, as the energy of the electrons incident on a sample increases, the energy that the electrons or, more generally, the massive particles introduce into the sample also increases. However, on account of potential damage to a sensitive sample, a great energy influx by fast electrons or massive particles into a sample to be examined is often undesirable. Reducing the kinetic energy of the electrons in order to minimize the destructive potential thereof and, instead, providing the greatest possible increase in the aperture angle of a massive particle beam incident on a sample lends itself as a solution to this dilemma.

In general, the creation of a low-aberration electron beam or, more generally, of a massive particle beam is significantly more difficult than the generation of a low-aberration optical beam. When the aperture angle of the electron beam is increased, the aberration problem increases exponentially, in particular as a result of a great increase in spherical aberrations, and so there is the risk of the employable resolution of an electron beam microscope being determined not by the diffraction limit of the electron beam but by the aberrations of the wavefront of the latter.

The present invention therefore addresses the problem of specifying a method and an apparatus that allow the above-described dilemma to be at least partly avoided.

SUMMARY

According to one exemplary embodiment of the present invention, this problem is at least partly solved by the subject of the independent claims of the present application. Exemplary embodiments are described in the dependent claims.

In one embodiment, a method for determining a wavefront of a massive particle beam includes the following steps: (a) recording two or more images of a reference structure using the massive particle beam under different recording conditions; (b) generating point spread functions for the two or more recorded images with a modified reference image of the reference structure; and (c) performing a phase reconstruction of the massive particle beam on the basis of the generated point spread functions and the different recording conditions, for the purposes of determining the wavefront.

A modified reference image is used in place of a reference image for the purposes of generating the point spread functions of the images of the reference structure. This can largely prevent the point spread functions generated from the recorded images from containing artefacts which are contained in the images of the reference structure that are generated by use of the massive particle beam. Consequently, substantially no specific properties of the massive particle beam or its detection process, which are reflected in the recorded images, have an effect on the wavefront ascertained from the point spread functions.

As a result, the deviations of the ascertained wavefront of the massive particle beam from a specified wavefront, for instance a spherical wavefront, can be corrected in systematic fashion. As a result of this, a microscope that uses a massive particle beam can be operated with a low kinetic energy of the massive particles and, at the same time, a large aperture angle of the massive particle beam, without the diffraction-limited resolution limit thereof being limited by aberrations of the wavefront of said particle beam.

Here, in systematic fashion means that the aberrations present in the wavefront of the massive particle beam are not optimized in phenomenological fashion in respect of a certain quantity, for instance the image contrast, but are corrected systematically to the best possible extent, i.e., with the inclusion of all known aberrations.

In this application, a massive particle denotes a particle whose rest mass is greater than zero ($m_o > 0$).

Here and elsewhere in this description, the expression "substantially" denotes an indication of a measurement quantity within the measurement uncertainty if measurement devices according to the prior art are used to measure the corresponding quantity.

The different recording conditions may comprise different parameter settings of a source and/or of an imaging system of the massive particle beam and/or different parameter settings of a detection apparatus for recording the images.

The different parameter settings of the source and/or of the imaging system may comprise: a kinetic energy of the massive particle beam, a diameter of the focal spot of the massive particle beam, an aperture angle of the massive particle beam, and a stigmator setting. The different parameter settings of the detection apparatus may comprise: an acceleration voltage of a detector, an energy filter of a detector and a detector type.

The different recording conditions may comprise different focus settings of the massive particle beam when recording the two or more images. The two or more recorded images may comprise images of at least one focus stack of the reference structure. A focus stack may comprise two or more images. If the distance from the focus at which an image was recorded can be established with very high precision, a single recorded image may already supply useful or helpful information for correcting artefacts. However, a plurality of images are usually recorded in order thereby to be able to establish and correct a possible error when determining the focal position.

Further, the different recording conditions may comprise recording two or more images under different angles of incidence of the massive particle beam on the reference structure. As an alternative to the recording of a focus stack, images of the reference structure can be recorded from different perspectives and point spread functions that are then used, in turn, to perform a phase reconstruction (phase retrieval) can be generated on the basis of these images. To this end, it is necessary to calculate modified reference images for the reference structures recorded from different perspectives or different angles. The entire wavefront to be determined can be reconstructed from the wavefronts determined in sections.

In optics, the images of a focus stack are often used as input quantities for reconstructing the phase or the wavefront of a particle beam, for instance a photon beam. For massive particle beams, this principle can likewise be used to reconstruct the wavefront thereof.

Different recording conditions may comprise different types of reference structures. The reference structure may have different geometric forms. By way of example, the reference structure could comprise a cube, a cuboid, a pyramid and a cylinder. The one or more reference structures can comprise a material composition that differs from the material of the substrate, to which the reference structure(s) is/are applied. As a result of different material compositions, a material contrast also arises when recording an image, in addition to a topology contrast. This maximizes the contrast of the recorded images of the reference structure.

The massive particle beam may have a specified energy. Further, the massive particle beam may have a predetermined width of an energy distribution. Typically, the width of the energy distribution, for example of an electron beam, is determined by the achievable energy resolution of the electron source and currently lies at approximately 0.5 eV (electron volt). Consequently, this quantity is largely independent of the potential through which the electrons pass for the purposes of their acceleration and accordingly largely independent of the energy of the beam electrons.

A reference image of the reference structure can represent at least one recording of the reference structure using the massive particle beam, in which the reference structure is arranged in the focus of the massive particle beam. The reference image could also comprise a combination of a plurality of images recorded in the focus using the massive particle beam, for example within the meaning of a mean value. Further, the reference image of the reference structure can be corrected in respect of artefacts.

A modified reference image of the reference structure can substantially correct artefacts when recording the two or more images of the reference structure.

A modified reference image of the reference structure can substantially correct artefacts in the two or more recorded images when generating the point spread functions for the two or more recorded images. This allows an influence of these artefacts on the generated point spread functions to be substantially prevented. This prevents these artefacts from being able to have an effect on the determination of the wavefront of the massive particle beam.

Artefacts may be caused by: electrostatic charging of the reference structure by the massive particle beam and/or at least one edge effect of at least one edge of the reference structure in the two or more recorded images when imaging the reference structure using the massive particle beam.

Typically, massive particles that originate from a half-space above the sample, which has certain lateral dimensions, are used within a detection process for a massive particle beam that interacts with a sample. The space above the sample, from which massive particles used for detection purposes originate, is either increased or reduced if the sample has a sharp edge. This is expressed in an increase (an edge generates a half-space increase and appears brighter than the surroundings) or a decrease in the detected signal (a corner generates a half-space reduction and appears darker than the surroundings) along an edge of the reference structure.

Should the reference structure or parts of the reference structure be electrostatically charged when recording the images using the massive particle beam, the particle beam images the reference structure or parts of the reference structure in distorted fashion. Should these effects of a massive particle beam, or of the detection process thereof, not be corrected in the reference image, with the aid of which the point spread functions are generated, prior to the generation of the point spread functions from the recorded images, said effects are reflected in the generated point spread functions and hence are ultimately also reflected in the wavefront determined for the massive particle beam.

Correcting the at least one artefact may comprise: determining an effect of electrostatic charging of the reference structure and/or of the at least one edge effect in the two or more recorded images.

Determining the effect of the electrostatic charging of the reference structure and/or of the at least one edge effect may comprise: simulating the electrostatic charging of the reference structure and/or the at least one edge effect. Simulating the electrostatic charging of the reference structure and/or the at least one edge effect can be implemented by use of a model that models an interaction between the massive particle beam and the reference structure and/or between the massive particles produced in the reference structure by the massive particle beam and the reference structure. Correcting the at least one artefact may comprise: removing the ascertained effects of the electrostatic charging and/or of the at least one edge effect from the reference image.

Correcting the at least one artefact may comprise modifying the reference image of the reference structure. Modifying the reference image of the reference structure may comprise image processing of the reference image. The image processing can be implemented on the basis of data of a simulation of the electrostatic charging of the reference structure and/or on the basis of data of the simulation of the at least one edge effect.

Generating point spread functions may comprise: deconvolving the two or more recorded images with the modified reference image of the reference structure. The generated point spread functions may comprise the intensity distributions of the massive particle beam in the planes of the two or more images.

The modified reference image may correspond to a non-modified reference image.

A method according to the invention can also be carried out using a reference image that has not been modified. By way of example, this may be expedient if there is substantially no electrostatic charging on a surface of the reference structure and/or if the massive particle beam only causes small-scale edge effects at edges of the reference structure.

In an alternative embodiment, the two or more recorded images can be used to generate corrected images, which are corrected in respect of artefacts that are contained in the two or more recorded images on account of the massive particle beam. To this end, the two or more recorded images could be corrected using a measured point spread function. The artefacts can be removed by calculation from the corrected images.

The method for determining a wavefront of a massive particle beam may further include the step of: providing the reference structure and/or characterizing the reference structure using the massive particle beam. Providing the reference structure can comprise the provision of design data of the reference structure. Characterizing the reference structure can comprise the determination of a reference image of the reference structure from design data. Characterizing the reference structure can comprise the recording of a reference image using a massive particle beam. Characterizing of the reference structure can comprise the recording of at least one image of the reference structure using the massive particle beam, wherein the reference structure is arranged in the focus of the massive particle beam.

The design data, the reference image of the reference structure and/or the modified reference image of the reference structure can be provided in a non-volatile memory.

The reference structure can comprise at least one needle-shaped material arrangement, which is arranged on a substrate, and the needle-shaped material arrangement and the substrate should have different material compositions. The needle-shaped material arrangement may comprise a metal or a metal compound and the substrate may comprise quartz or carbon. Should the reference structure and the substrate, to which the reference structure has been applied, have an identical material composition, the reference structure only produces a weak topology contrast in a recorded image, as a result of which the reference structure only stands out weakly, or not at all, from the substrate in the recorded image.

The needle-shaped material arrangement can have a lateral dimension in the range of 0.1 nm to 10 μm, preferably of 0.2 nm to 500 nm, more preferably of 0.5 nm to 100 nm, and most preferably of 1 nm to 50 nm. The needle-shaped material arrangement can have a height from 1 nm to 1000 nm, preferably from 2 nm to 200 nm, more preferably from 3 nm to 100 nm, and most preferably from 4 nm to 20 nm. The needle-shaped material arrangement may comprise a cylindrical structure.

The reference structure may comprise at least one sharp edge and/or at least one defined side wall angle. The sharp edge may have a radius of curvature of $<10^{-3}$ mm, preferably $<10^{-4}$ mm, more preferably $<10^{-5}$ mm, and most preferably $<10^{-6}$ mm. The side wall angle may have an angle of $>45°$, preferably $>80°$, more preferably $>85°$ and most preferably $>89°$. A thin reference structure, i.e., a reference structure having a low height, reduces topography effects if secondary electrons, for example, are used to detect the massive particle beam when recording the two or more images. A lower boundary for the height of the reference structure is given by the fact that substantially no secondary particles of the substrate lying below the reference structure should reach the detection system when irradiating the reference structure using the massive particle beam, said detection system being used to record the images of the reference structure, so as not to falsify the measurement of the reference structure.

Generating a modified reference image may comprise: recording two or more reference images at different kinetic energies of the massive particle beam under the best-possible recording conditions and replacing the modified reference image by a combination of the reference images recorded at different energies.

A modified reference image, the correction of which is typically calculated, can be replaced to a good approximation by a measurement image generated from measurements if it is possible to record a plurality of reference images at different kinetic energies of the massive particle beam using an imaging system that comes as close as possible to a perfect imaging system.

Further, a modified reference image could be produced from a combination of a calculated reference image and one or more measured reference images.

The method according to the invention may further include the step of: modifying the determined wavefront of the massive particle beam so that the altered wavefront substantially corresponds to a specified wavefront.

Correcting the aberrations of the wavefront of the massive particle beam is not implemented by way of a "blind" reduction in the aberrations in relation to a selected parameter and hence by maximizing a certain metric. Instead, the method described in this application allows the effects of the various known imaging aberrations to be taken into account when correcting the determined wavefront. As a result, the extent of the corrections of the aberrations and the efficiency of the correction of the wavefront of the massive particle beam can be significantly increased. The efficiency of the correction of the wavefront means that only a few iterations are required to obtain a wavefront that corresponds to a specified wavefront within a defined deviation.

In one embodiment, an apparatus for determining a wavefront of a massive particle beam comprises: (a) means for recording two or more images of a reference structure using the massive particle beam under different recording conditions; (b) means for generating point spread functions for the two or more recorded images with a modified reference image of the reference structure; and (c) means for performing a phase reconstruction of the massive particle beam on the basis of the generated point spread functions and the different recording conditions, for the purposes of determining the wavefront.

The apparatus can be embodied to record a reference image of the reference structure.

The apparatus may comprise adjustment options for adapting a determined wavefront of the massive particle beam to a specified wavefront.

The aperture angle of the massive particle beam may have a range of 0.1 mrad to 1000 mrad, preferably 0.2 mrad to 700 mrad, more preferably 0.5 mrad to 500 mrad and most preferably 1 mrad to 200 mrad. Here, the abbreviation "mrad" denotes milliradians.

A computer program may comprise instructions that prompt a computer system of the apparatus specified above to carry out the method steps of one of the above-described methods when the computer system executes the computer program.

DESCRIPTION OF DRAWINGS

The following detailed description describes currently preferred exemplary embodiments of the invention, with reference being made to the drawings, in which.

DETAILED DESCRIPTION

Currently preferred embodiments of a method according to the invention and of an apparatus according to the invention are explained below. The apparatus according to the invention is explained using the example of a scanning electron microscope (SEM). However, the method according to the invention and the apparatus according to the invention are not restricted to a massive particle beam in the form of an electron beam. Rather, these can be used for any particle beam, the particles of which have a rest mass that differs from zero. Moreover, these can be used for microscopes that use a scanning focused massive particle beam for recording an image, or for wide-field microscopy. Massive particle beam and particle beam are used synonymously hereinafter.

A few explanations regarding the resolution of scanning electron microscopes are found at the start of the fifth part of the description. The de Broglie wavelength of an electron, and hence of an electron beam, is given by the following equation:

$$\lambda = \frac{h}{\sqrt{2 \cdot e \cdot U \cdot m}}, \tag{1}$$

where $\lambda$ denotes the wavelength, h denotes Planck's constant, e denotes the elementary electric charge, U denotes the acceleration voltage through which an electron passes and m denotes the mass of the electron. At the voltages used for accelerating the electrons in a microscope, the mass of the electron can approximately be equated to the rest mass $m_0$ thereof ($m=m_0$).

The following mathematical relationships are taken from the publication J. E. Barth, P. Kruit: "Addition of different contributions to the charged particle probe size," Optik, Vol.

101, p. 101-109 (1996). The diffraction limit of an electron beam is approximately described by the following equation:

$$R_D(50\%) \approx 0.265 \cdot \frac{\lambda}{\alpha}. \quad (2)$$

Figure 1:
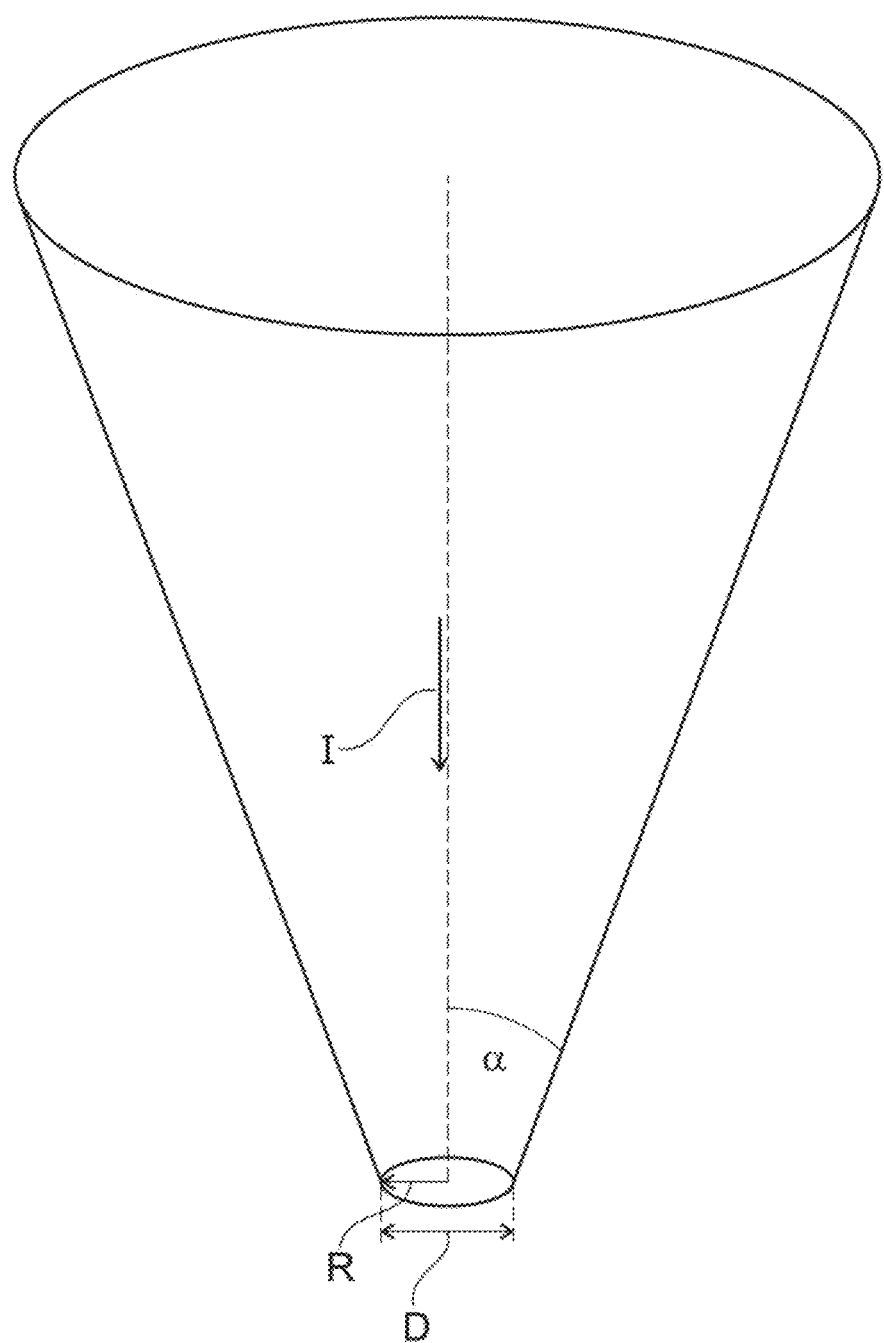
FIG. 1 illustrates a schematic representation of a focused particle beam with a spot diameter, and the aperture angle thereof.

Here, $R_D$ denotes the radius of the spot diameter D of an electron beam or of a charged particle beam in the focus thereof. The angle $\alpha$ characterizes the aperture angle of the electron beam, as measured in relation to the beam axis. FIG. 1 elucidates these relationships. Electron beams often have beam profiles or intensity profiles that correspond to a Gaussian distribution or that are at least similar to the latter. The specification of 50% in the spot radius of the focus $R_D$ means that the aperture angle $\alpha$ specifies the angle at which the intensity of the electron beam has dropped to half the maximum value (HWHM, half width half maximum). As already explained in the introductory part, the de Broglie wavelength of massive particles reduces with increasing energy thereof, as a result of which the diffraction limit is displaced to lower radii or spot diameters. As may be gathered from Equation (2), the aperture angle $\alpha$ of a massive particle beam affects the diffraction limit in inversely proportional fashion. Consequently, increasing the aperture angle $\alpha$ allows an increase in the resolution of an electron beam or, more generally, a massive particle beam while the kinetic energy of the particles thereof remains unchanged.

In addition to the diffraction of the electron beam or, more generally, of the massive particle beam, the finite brightness B of the electron beam and the finite area of the beam source also have an influence on the resolution of an electron beam or a massive particle beam. This contribution can be expressed by the following formula:

$$R_I(50\%) = \frac{1}{\pi \cdot \alpha} \cdot \sqrt{\frac{I}{B \cdot E}}, \quad (3)$$

where I describes the current of the electron beam, B describes its brightness and E describes the kinetic energy of the electrons. The contribution of finite brightness or its spot radius in the focus increases with increasing current of the particle beam I. A higher kinetic energy of the particles or of the electrons reduces this contribution. Similar to the diffraction limit $R_D$, the spot radius of finite brightness $R_I$ varies inversely proportional to the aperture angle $\alpha$ of an electron beam or, more generally, of a massive particle beam.

As likewise already indicated in the introductory part, aberrations of the components of an imaging system of a massive particle beam may likewise have a significant influence on the resolution of a massive particle beam. The effects of chromatic aberrations, the causes of which lie in a finite energy distribution $\Delta E$ of the particles within the particle beam, can be represented as follows by way of a formula:

$$R_C(50\%) \approx 0.17 \cdot C_C \cdot \frac{\Delta E}{E} \cdot \alpha, \quad (4)$$

where $\Delta E$ denotes the full width at half maximum (FWHM) of the energy distribution of the particles of the massive particle beam and $C_C$ is a design-specific constant. As already explained above, the width of the energy distribution of an electron beam is primarily determined by the energy distribution of the electrons produced by the source. Currently available electron sources typically have an energetic distribution $\Delta E$ of 0.5 eV to 0.7 eV. The imaging aberrations caused by chromatic aberrations can be reduced, firstly, by narrowing the energy distribution of the particles of the massive particle beam or, in the case of an unchanged energy distribution, by an increase in the mean energy of a particle beam. However, secondly, the contribution of chromatic aberrations increases linearly with increasing aperture angle $\alpha$ of the particle beam.

Spherical aberrations are caused by aberration-afflicted imaging in regions of components or elements of a beam optical unit that are distant from the axis. The contribution of spherical aberrations to the resolution of a microscope based on the use of a massive particle beam can be expressed as follows:

$$R_S(50\%) \approx 0.0884 \cdot C_S \cdot \alpha^3, \quad (5)$$

where $C_S$ once again is a design-specific constant. The spot diameter in the focus of the particle beam $R_S$ caused by spherical aberrations increases with the third power of the aperture angle $\alpha$ of the electron beam. For this reason, spherical aberrations are quickly gaining importance when increasing the aperture angle of the particle beam and must be taken into account when analyzing the resolution of a particle beam-based microscope that uses a massive particle beam, like in the case of conventional optical systems.

Further imaging aberrations, for instance an astigmatism, coma, a jitter of the particle beam, vibrations of the microscope in which the massive particle beam is used, can also be taken into account, where necessary, when considering the resolution. These contributions are neglected in the following example.

The resolution $R_{total}$ of a particle beam-based microscope is determined by the addition of the squares of the various contributions that have an influence on the resolution limit of a particle beam:

$$R_{total}^2 = R_D^2 + R_I^2 + R_C^2 + R_S^2 \quad (6)$$

Figure 2:
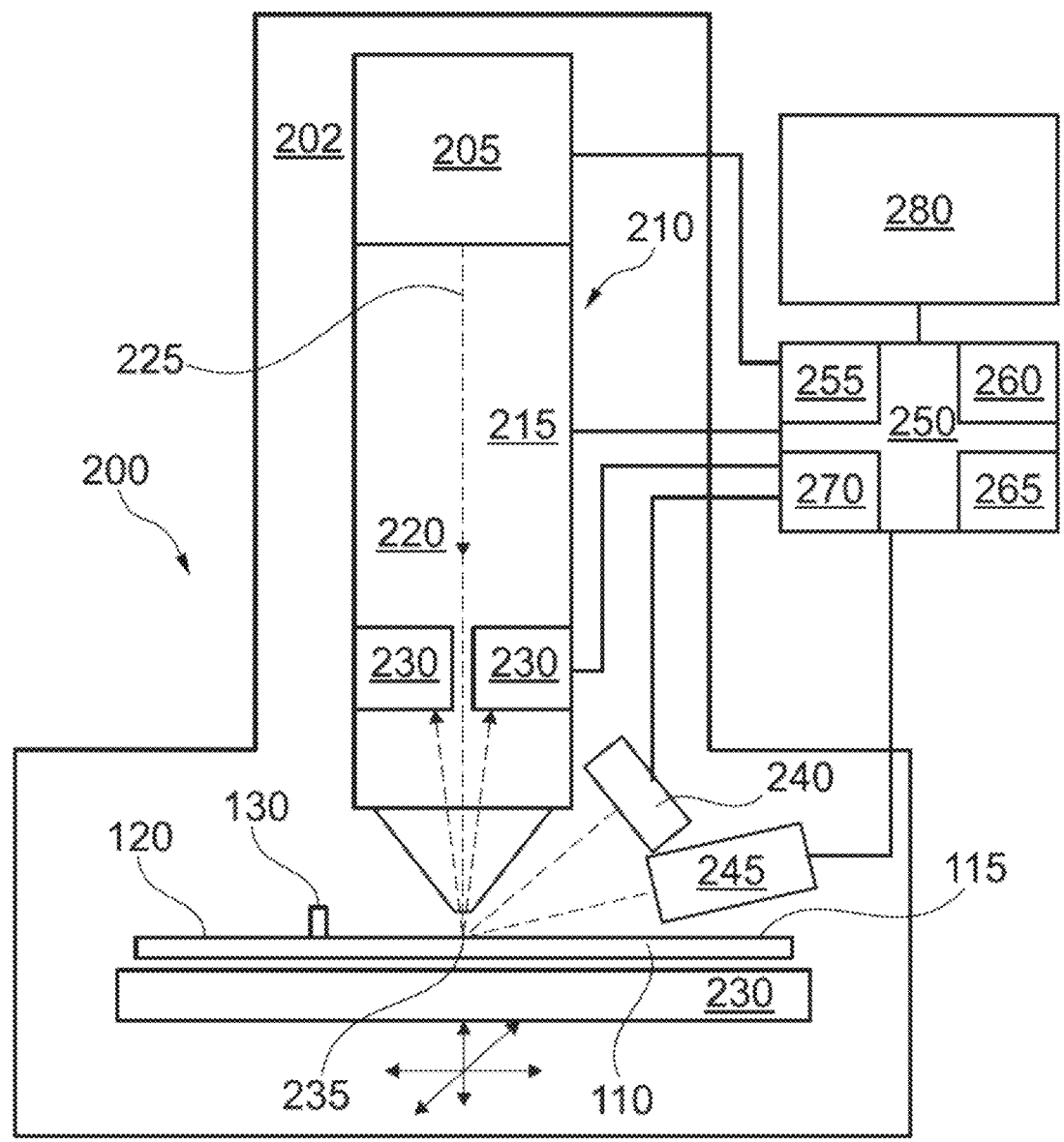
FIG. 2 shows a schematic section through a few important components of an apparatus for determining a wavefront of the massive particle beam.

FIG. 2 schematically shows, in a section, some components of an apparatus 200 for determining a wavefront of a massive particle beam. The exemplary apparatus 200 of FIG. 2 is embodied in the form of a scanning electron microscope (SEM) 210. The latter is disposed in a vacuum chamber 202. The scanning particle microscope 210 is composed of a particle emitter 205 and a column 215, in which the beam optical unit 220, for instance in the form of an electron optical unit 220 of the SEM 210, is disposed. The particle emitter 205 produces a massive particle beam 225 and the electron or beam optical unit 220 focuses the particle beam 225 and directs the latter on a sample 110 at the output of the column 215.

A sample 110 may comprise a substrate 120, on the surface 115 of which a reference structure 130 is disposed. The substrate 120 may comprise a plurality of reference structures 130, which may be embodied in the form of various geometric figures (not illustrated in FIG. 2). The substrate 120 can comprise a quartz substrate and/or a substrate with a low coefficient of thermal expansion (LTE, low thermal expansion). However, the substrate 120 could also comprise a carbon substrate or a carbon-containing substrate. In general, any material yielding a good material contrast between the substrate and a reference structure 130 can be used as a substrate for the reference structure.

The reference structure 130 can comprise a metal or a metal compound. By way of example, the reference structure 130 could comprise chromium or tantalum or a chromium-containing or tantalum-containing compound. The reference structure 130 can comprise one or more geometric figures. Thus, the reference structure could be embodied in the form of a cube, a cuboid or a cylinder, for example. Further, the reference structure 130 may comprise at least one sharp edge and/or at least one steep side wall angle. By virtue of the substrate 120 and the reference structure 130 having different material compositions, the reference structure 130 is additionally highlighted by a material contrast, in addition to its topology contrast, in an image recorded by a massive particle beam.

By way of example, in the apparatus 200, the substrate 120 can comprise the substrate of a photolithographic mask or of a template from nanoimprint lithography. The photolithographic mask may comprise a transmissive photomask or a reflective photomask. The photolithographic mask can comprise any mask type, for instance binary masks, phase-shifting masks, MoSi (molybdenum silicide) masks, or masks for a dual or multiple exposure. One or more reference structures 130 can be arranged on a photolithographic mask or on a template for nanoimprint lithography.

The sample 110 is disposed on a sample stage 230 or a sample holder 230. A sample stage 230 is also known as a "stage" in the art. As indicated by the arrows in FIG. 2, the sample stage 230 can be moved in three spatial directions relative to the column 215 of the SEM 210, for example by way of micro-manipulators that are not illustrated in FIG. 2. The particle beam 225 strikes the sample 110 at the measurement point 235. Consequently, by way of its displacement along the beam axis of the particle beam 225, i.e., in the z-direction, the sample stage 230 facilitates the recording of a focus stack of images of a reference structure 130. Further, the six-axis sample stage 230, by way of a tilt and/or rotation thereof, allows a reference structure 130 to be recorded from various angles or perspectives. The respective positions of the various axes of the sample stage 230 are measured by interferometry (not reproduced in FIG. 2). In an alternative embodiment, the focus setting of the particle beam 225 can be set or altered with the aid of the electron optical unit 220 of the SEM 210. Combined adjustments by moving the sample stage 230 and by setting the electron optical unit 220 are also possible.

As already explained above, the apparatus 200 in the exemplary embodiment elucidated in FIG. 2 comprises an SEM 210. An electron beam 225 as a massive particle beam 225 is advantageous in that the latter can be produced and formed relatively easily. However, it is also possible to use an ion beam, an atom beam or a molecule beam (not illustrated in FIG. 2) in the apparatus 200. In general, the apparatus 200 can use a particle beam 225, the particles of which have a rest mass that differs from zero.

Further, the apparatus 200 of FIG. 2 may comprise one or more scanning probe microscopes, for example in the form of an atomic force microscope (AFM) (not shown in FIG. 2), which can be used to analyze and/or process the sample 110.

A detector 230, which is disposed in the column 215 of the scanning particle microscope 210, converts the secondary electrons produced by the electron beam 225 at the measurement point 235 and/or electrons backscattered from the sample 110 into an electrical measurement signal and forwards the latter to an evaluation unit 265 of a computer system 250 of the apparatus 200. The detector 230 may contain a filter or a filter system in order to discriminate the electrons in terms of energy and/or solid angle (not reproduced in FIG. 2).

The SEM 210 of the apparatus 200 may further comprise a second detector 240 for detecting the secondary electrons and/or backscattered electrons produced at the measurement point 235 by the incident electron beam 225. By way of example, the detector 240 may comprise an Everhart-Thornley detector.

Moreover, the scanning particle microscope 210 may comprise an ion source 245 that provides low-energy ions in the region of the first measurement point 235 for the case where the sample 110 and/or the reference structure 130 are electrically insulating or have an electrically insulating surface layer 115.

The apparatus 200 contains a computer system 250. The computer system 250 comprises a scanning unit 255, which scans the electron beam 225 over the sample 110 and at least partly over the reference structure 130.

Further, the computer system 250 comprises a setting unit 260 for setting and controlling the various parameters of the scanning particle microscope 210 of the apparatus 200. The parameters of the SEM 250 may comprise: an energy of the particle beam 225 or of the electron beam 225, an aperture angle of the particle beam 225, a stigmator setting of the beam optical unit 220 of the particle beam 225, adjustment options for changing spherical and/or chromatic aberration, coma and astigmatism. Moreover, the SEM 210 of the apparatus 200 comprises adjustment options for correcting the higher-order aberrations. Thus, the SEM 210 can correct aberrations that are described by the Zernike polynomials of the first two orders ($Z_0^0$, $Z_1^{-1}$ $Z_1^1$, $Z_2^{-2}$, $Z_2^0$, $Z_2^2$). In order to be able to carry out higher-order corrections, adjustment options that can produce fields with three-pole or higher-order pole properties are required.

Further, the setting unit 260 of the SEM 210 sets the parameters of the detectors 230 and 240. Moreover, the setting unit 260 of the computer system 250 of the SEM 210 controls the six axes of the sample stage 230.

Moreover, the computer system 250 comprises an evaluation unit 265, which analyzes the measurement signals from the detectors 230 and 240 and produces an image therefrom, said image being able to be displayed on the display 280 of the SEM 210. The region in which the scanning unit 255 scans the electron beam 225 or the massive particle beam 225 over the sample 110 and/or the reference structure 130 is displayed on the monitor 280 of the computer system 250 and is therefore specified as the field of view or FOV of the scanning particle microscope 210. In particular, the evaluation unit 265 is designed to generate an image of the reference structure 130 from the measurement data of the detector 230 or of the detectors 230, 240. If the focus of the particle beam 225 is aligned on the reference structure 130, the evaluation unit 265 can generate a reference image of the reference structure 130 from the measurement data of the detectors 230, 240 should the massive particle beam 225 scan over the reference structure 130. An image generated from the measurement data by the evaluation unit 265 when the particle beam 225 scans the reference structure 130 in the focus may, however, also be a portion of the images of a focus stack of the reference structure 130.

The evaluation unit 265 likewise processes the measurement signals of the distance measuring devices of the interferometer or interferometers of the sample stage 230 and can likewise represent these graphically and/or numerically on the monitor 280.

Moreover, the evaluation unit 265 is designed to take account of electrostatic charging of the sample 110 or of the reference structure 130 when depicting a scan region on the monitor 280 and hence when generating a reference image for the reference structure 130. Further, the evaluation unit 265 can instruct the scanning unit 255 to take account of electrostatic charging of the reference structure 130 when carrying out its scans. Moreover, the evaluation unit 265 can prompt the computer system 250 to at least partly compensate the electrostatic charging of the reference structure 130 by way of a local irradiation of the latter using low-energy ions of the ion source 245.

Figure 3:
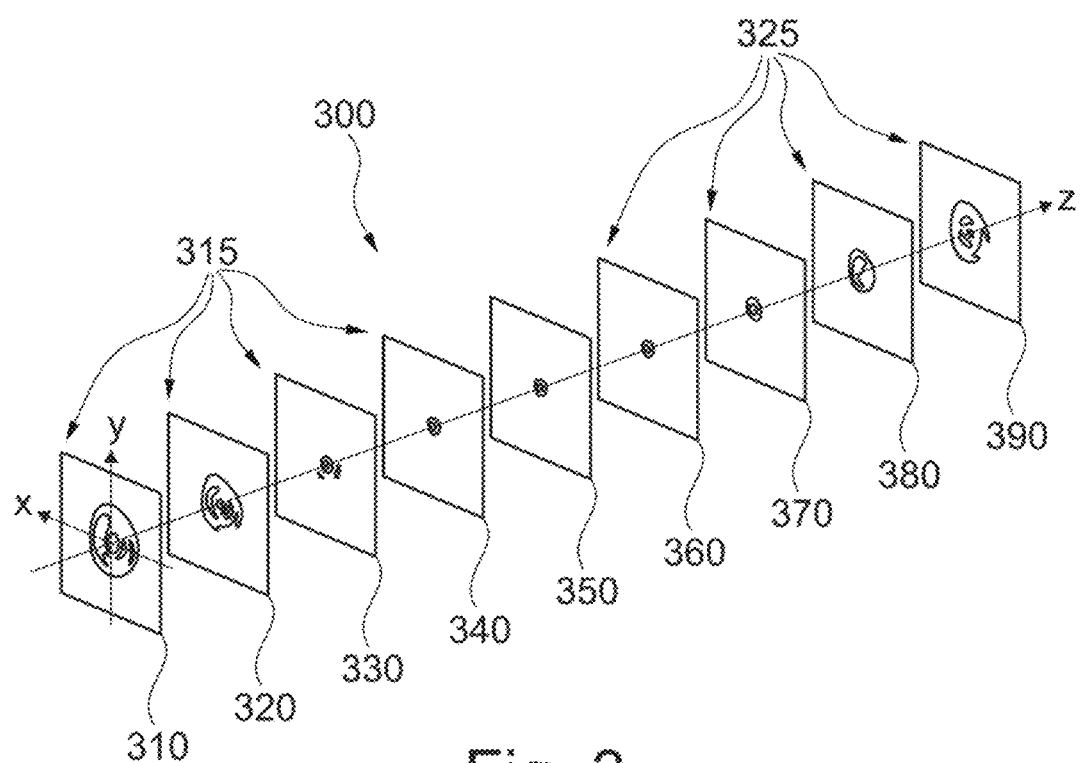
FIG. 3 schematically reproduces a focus stack of images of a reference structure, which were recorded using the massive particle beam of the apparatus of FIG. 2.

For the purposes of recording the images of a focus stack of the reference structure 130, the setting unit 260 displaces the sample stage 230 along the beam axis of the particle beam 225, i.e., in the z-direction. FIG. 3 schematically shows the images 310 to 390 of a focus stack 300 of the reference structure 130. The exemplary reference structure 130 of FIG. 3 has a circular surface and a cylindrical structure. In the example illustrated in FIG. 3, the focus stack comprises nine images 310 to 390 of the reference structure 130. The focus stack 300 starts at image 310 with over-focusing (+defocusing), i.e., the focus lies above or in front of the reference structure 130, and progresses over the image 350 in focus towards increasing under-focusing (−defocusing), where the focus lies in the reference structure 130. The evaluation unit 265 generates the images of the focus stack 300 of the reference structure 130 from the measurement data of at least one detector 230, 240 at the respective defocusing positions 315 and 325. The evaluation unit 265 can be embodied in the form of hardware, software, firmware and/or a combination thereof.

Returning to FIG. 2, the computer system 250 of the SEM 210 further comprises a simulation unit 270. The simulation unit 270 is designed to ascertain by calculation the effects which the particle beam 225 generates in conjunction with the detector or detectors 230, 240 on account of a specific detection process of the secondary particles produced by a massive particle beam 225. As already explained in the third part of this description, electrostatic charging of the reference structure 130 may lead to a distorted display of a reference image.

Figure 4:
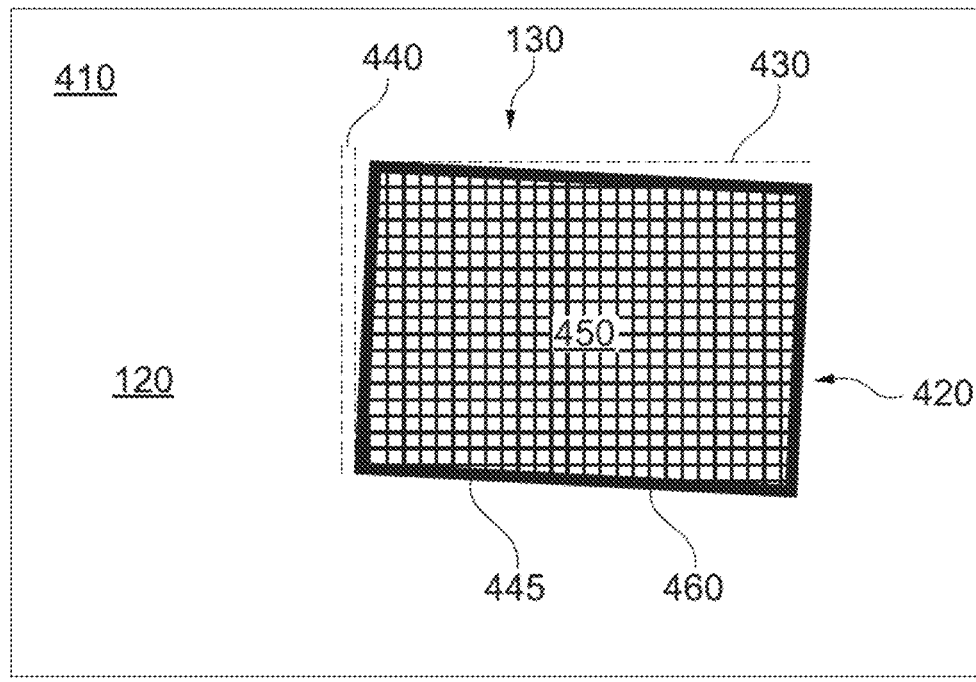
FIG. 4 represents a schematic plan view of a reference image of a reference structure in the upper partial image and illustrates a modified reference image of the reference structure following the correction of the artefacts of the upper partial image in the lower partial image.
Figure 4:
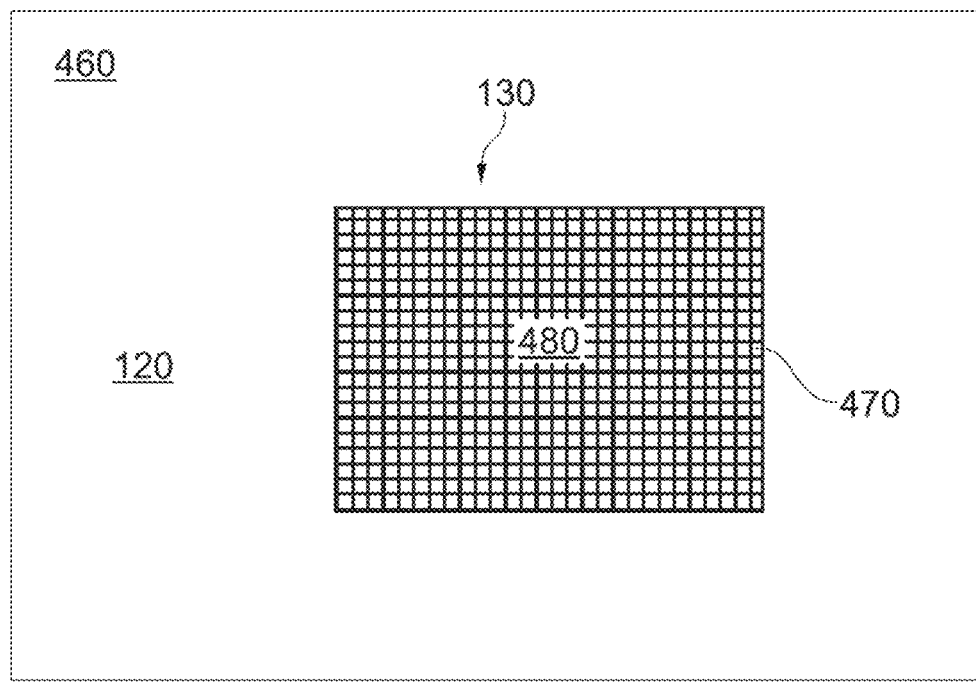

In the upper partial image 410, FIG. 4 schematically shows a plan view of the image 450 of the reference structure 130 in focus, said reference structure being disposed on a substrate 120. The substrate 120 can comprise the substrate 120 of the sample 110. This means that the image 450 in the upper partial image 410 of FIG. 4 is a reference image 450 of the reference structure 130. The exemplary reference structure 130 of FIG. 4 has a rectangular form. Under the influence of electrostatic charging 420, the reference image 450 has a distortion 430 and a displacement 440 of the reference image 450 in relation to the design data of the reference structure 130.

The simulation unit 270 of the computer system 250 of FIG. 2 may contain, e.g., a model that describes electrostatic charging 420 and the image distortion caused thereby on the basis of a material composition of the reference structure 130 and the kinetic energy with which the electrons or particles of the particle beam 225 are incident on the reference structure 130.

Further, the simulation unit 270 of the computer system 250 can be designed to ascertain by calculation the effects of a change in the half-space, from which the secondary particles for image generation originate, on account of a specific geometry of the reference structure 130 on the basis of the geometry of the reference structure 130 and the energy of the particle beam 225. The upper partial image 410 of FIG. 4 elucidates an edge effect 460 caused by the reference structure 130, said edge effect being illustrated by the broad delimiting line 445 in the reference image 450 of the reference structure 130.

The evaluation unit 265 of the computer system 250 of the apparatus 200 of FIG. 2 contains one or more algorithms that allow the specific effects 430, 440 and 460 of a particle beam-specific image recording process, as ascertained by the simulation unit 270, to be corrected in a reference image 450 of the reference structure 130. As a result, the evaluation unit 265 can generate a modified reference image 480 from a reference image 450. This is elucidated in the lower partial image 460 of FIG. 4. The artefacts caused by electrostatic charging of the reference structure 130 and by the edge effect 460 at the sharp edge 470 are substantially corrected in the modified reference image 480 of the reference structure 130.

The algorithms of the simulation unit 270 can be implemented in hardware, software or a combination thereof. By way of example, the authors S. Babin et al.: "Technique to automatically measure electron-beam diameter and astigmatism: BEAMETR," J. Vac. Sci. Technol. B 24(6), pp. 2056-2959 (November/December 2006), describe a method for determining a beam dimension of an electron beam by use of an automated process. The corresponding simulation program BEAMETR is available from eBeam Technologies.

Moreover, the simulation unit 270 is designed to determine the convolution kernels or the point spread functions of the images 310-390 of the focus stack 300 of the reference structure 130 from the images 310-390 of the focus stack 300 of the reference structure 130 and the modified reference image 480 of the reference structure 130 by carrying out deconvolution operations. Finally, the simulation unit 270 can be used to ascertain, on the basis of the point spread functions of the focus stack 300, the kinetic energy of the massive particles of the particle beam 225 when recording the images 310-390 of the focus stack 300 of the reference structure 130 and the respective defocusing positions 315, 325, the wavefront of the particle beam 225 when recording the images 310-390 of the focus stack 300 by way of carrying out a phase reconstruction.

The simulation unit 270 can perform the phase reconstruction by using a known algorithm, for example the Gerchberg-Saxton algorithm, the NLSQ (nonlinear least squares) algorithm, the Yang-Gu algorithm, the ping-pong algorithm or the Ferweda algorithm.

The computer system 250, the evaluation unit 265 and/or the simulation unit 270 can each contain a memory, preferably a non-volatile memory (not illustrated in FIG. 2), which contains one or more models of electric charging for various reference structures 130 and/or various models for edge effects 460, which are caused by a detection process when scanning a reference structure using a massive particle beam 225.

As specified in FIG. 2, the evaluation unit 265 and/or the simulation unit 270 can be integrated into the computer system 250. However, it is also possible to embody the evaluation unit 265 and/or the simulation unit 270 as dedicated units within or outside of the apparatus 200 (not specified in FIG. 2). In particular, the evaluation unit 265 and/or the simulation unit 270 of the computer system 250 can be designed to carry out some of their tasks by use of a dedicated hardware implementation.

The computer system 250 can be integrated into the apparatus 200 or embodied as an independent device (not shown in FIG. 2). The computer system 250 may be configured in hardware, software, firmware or a combination thereof.

Unlike what is illustrated in FIG. 2, the scanning particle microscope 210 of the apparatus 200 may comprise a multi-beam scanning particle microscope, which is able to direct a plurality of particle beams on the sample 110 at the same time (not illustrated in FIG. 2). A multi-beam scanning particle microscope comprises a detector or a detector arrangement, which can detect, in parallel, the secondary particles generated by the individual particle beams. Moreover, the evaluation unit 265 of a multi-beam scanning particle microscope can be designed to combine the partial images generated from the secondary particles of the individual particle beams to form an overall image.

Figure 5:
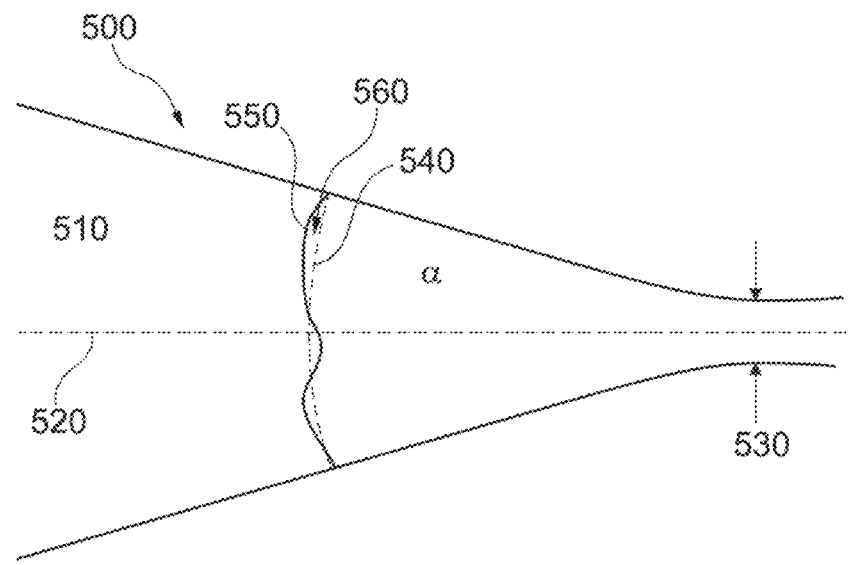
FIG. 5 schematically illustrates a section through a focused electron beam with an aberration-afflicted wavefront.

Diagram 500 of FIG. 5 schematically shows a section through a focused massive particle beam 510, which has an aperture angle α in relation to the beam axis 520. The particle beam 510 is focused onto a spot diameter 530 in the focus 560. The wavefront 550 which, as described above, was deconvolved from the images 310-390 of the focus stack 300 and the modified reference image 480 and ascertained with the aid of a phase reconstruction algorithm has relatively large deviations or aberrations 560 in relation to the wavefront 540 of an incoming spherical wave. The aberrations 560 prevent the resolution of the massive particle beam 510, which is limited by the diffraction limit of the particle beam 510 in the absence of aberrations, from being able to be fully exploited. This is prevented by the aberrations 560 of the wavefront 550 of the massive particle beam 510.

The ascertained wavefront 550 allows the aberrations 560 thereof to be corrected systematically. The SEM 210 of the apparatus 200 of FIG. 2 has adjustment options for correcting all substantial aberrations of the wavefront 550. The wavefront can be corrected in a number of ways. Firstly, the sensitivity of an adjustment option of the SEM 210, for example a coil current in the beam optical unit 220, can be measured for the various possible adjustment options of the SEM 210. Secondly, the wavefront can be corrected by calculation. To this end, it is necessary to have available a model for the effect of the various adjustment options of the SEM 210. Moreover, it is helpful if the SEM 210 has a high manufacturing accuracy.

Typically, an adjustment option of the SEM 210 does not only act on a single aberration, i.e., a linearly independent Zernike polynomial. Therefore, a so-called interaction matrix is formulated in a preferred procedure. Interaction matrices are known from adaptive optics. An interaction matrix can be formulated by calculation, i.e., on the basis of the design of the SEM 210, or from experimental results. When formulating the interaction matrix from experimental results, the effect on each linearly independent aberration is measured for each adjustment option of the SEM 210. The interaction matrix generated thus converts a vector of the adjustment options into a vector of the aberrations. Thereupon, a matrix inversion allows a matrix to be generated, the latter allowing a wavefront aberration (expressed in aberrations) to be converted into the vector of the adjustment options of the SEM 210 that is required for correction purposes.

Figure 6:
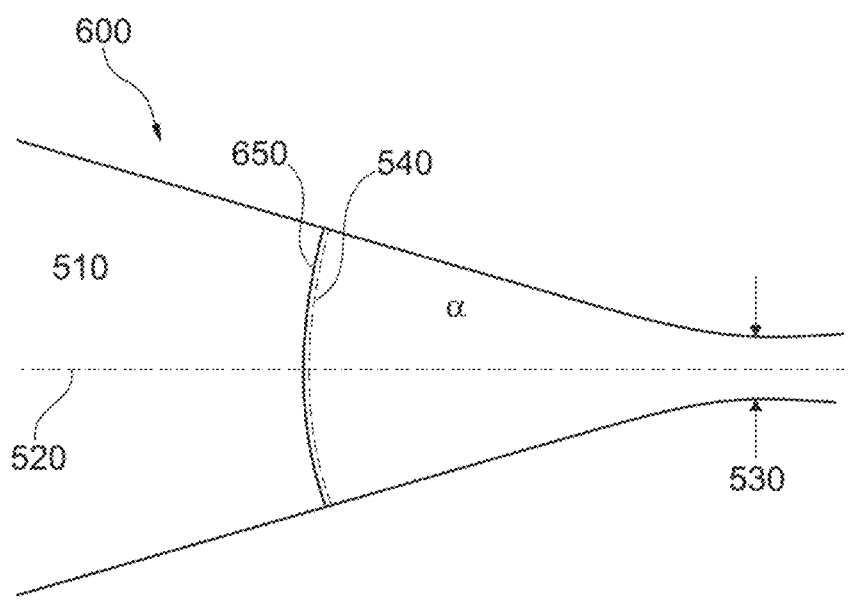
FIG. 6 shows the focused electron beam of FIG. 5 following a correction of the wavefront.

FIG. 6 presents the wavefront 550 of FIG. 5 following the correction of the aberrations 560. As may be gathered from FIG. 6, the corrected wavefront 650 substantially has the wavefront 540 of a spherical wave. As a result, the systematic correction of the determined wavefront 550 allows an SEM 210 using a massive particle beam 510 with a large aperture angle α to obtain the resolution limited by the diffraction limit of the particle beam 510 as usable resolution.

FIGS. 7 to 12 illustrate a first example for generating a point spread function for an electron beam 225, 510. The first example described in FIGS. 7 to 12 and the further examples presented below were carried out on the basis of simulations. In the two examples presented first, the reference structure 130 is embodied in the form of a cylinder with a diameter of 10 nm. By way of example, the cylinder can be produced by depositing chromium on a quartz substrate.

Figure 7:
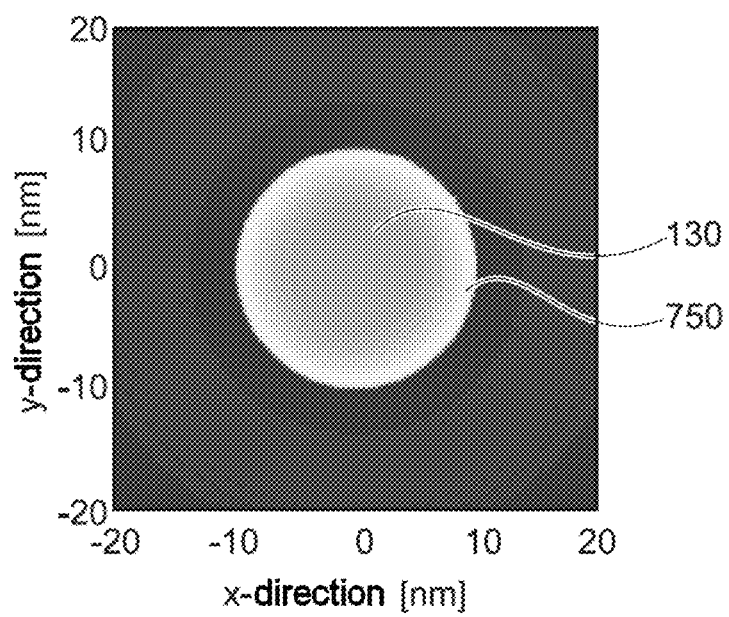
FIG. 7 illustrates a schematic plan view of a simulated image of a cylindrical reference structure.

FIG. 7 shows the simulated image of the cylindrical reference structure 130 when the latter is irradiated by an electron beam 225, 510, the electrons of which have a kinetic energy of 600 eV. The outer brighter edge 750 represents the edge effect 460 of the cylindrical reference structure 130.

Figure 8:
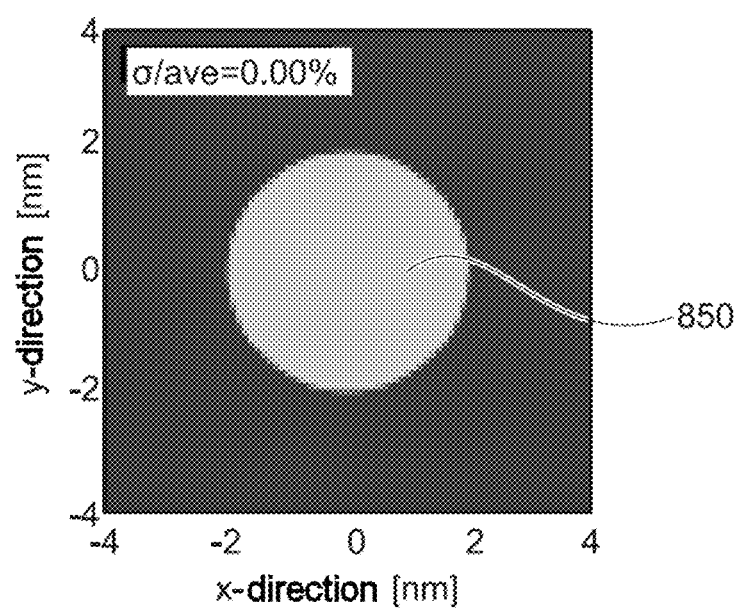
FIG. 8 presents a schematic plan view of a kernel used to simulate an electron beam, the intensity distribution of which in the focus is circular and homogenous and has a diameter of a 4 nm.

FIG. 8 presents a smeared kernel 850 for elucidating the effect of an electron beam 225, 510 with a diameter of 4 nm on the recording of an image of the cylindrical reference structure 130 of FIG. 7. The employed kernel 850 has in the focus a round beam with a perfectly plane surface. In FIG. 8, this is specified by a ratio of the standard deviation σ of the intensity and the mean intensity ave (σ/ave=0).

Figure 9:
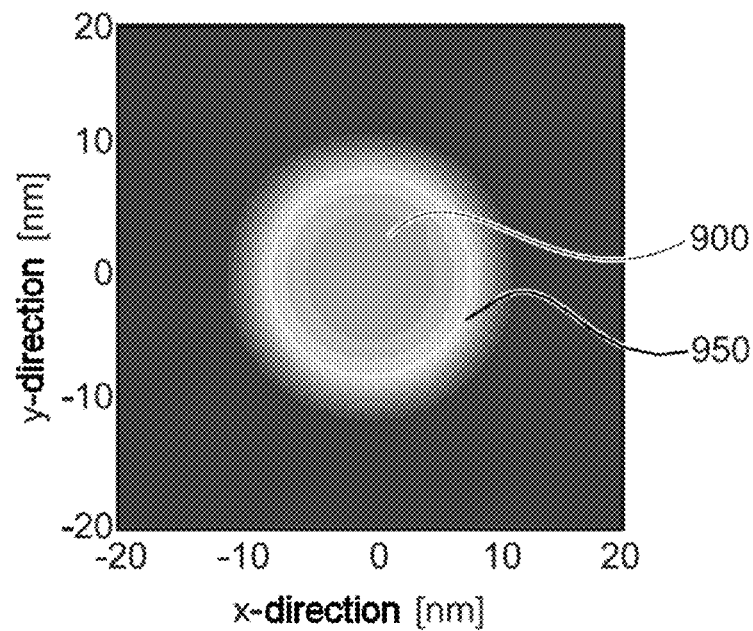
FIG. 9 presents a convolution of the image of FIG. 7 with the kernel of FIG. 8.

FIG. 9 reproduces a convolution of the cylindrical reference structure 130 of FIG. 7 with the 4 nm-wide electron beam 225, 510 or the kernel 850 of FIG. 8. The bright edge 750 of the image of FIG. 7 is clearly visible as a bright edge 950 in the smeared convolution image 900 of FIG. 9. FIG. 9 presents the image of the reference structure 130 which is visible on the monitor 280 of the SEM 210 when the reference structure 130 is scanned by the electron beam 225, 510.

Figure 10:
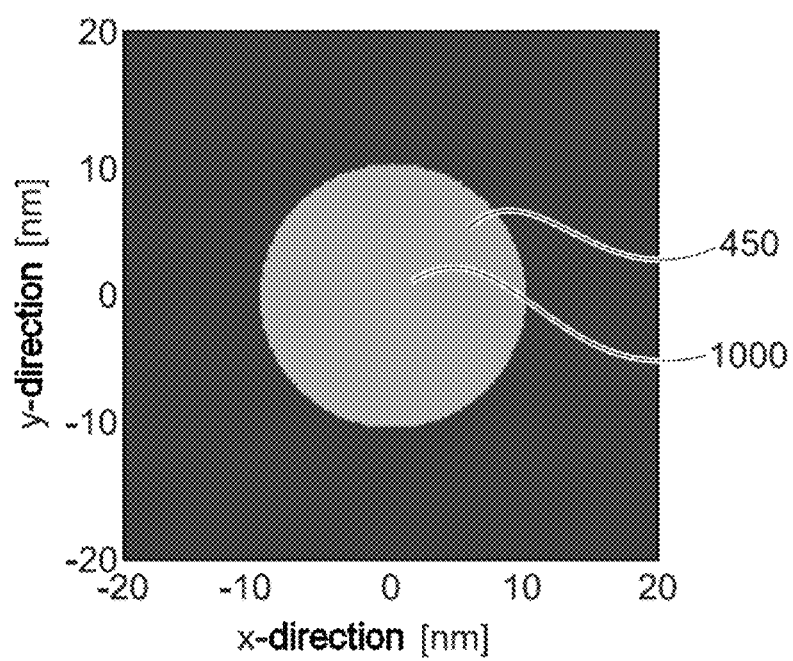
FIG. 10 shows a schematic plan view of a simulated reference image of the cylindrical reference structure of FIG. 7.

FIG. 10 shows a reference image 450 of the cylindrical reference structure 130, which is used to deconvolve the image 900 of FIG. 9. The reference image 450 has a homogeneous intensity distribution over the plane surface of the cylindrical reference structure 130. The reference image 450 is used to generate the convolution kernel 850 or the point spread function 850 of the electron beam 225, 510 from the smeared convolution image 900 by way of a deconvolution.

Figure 11:
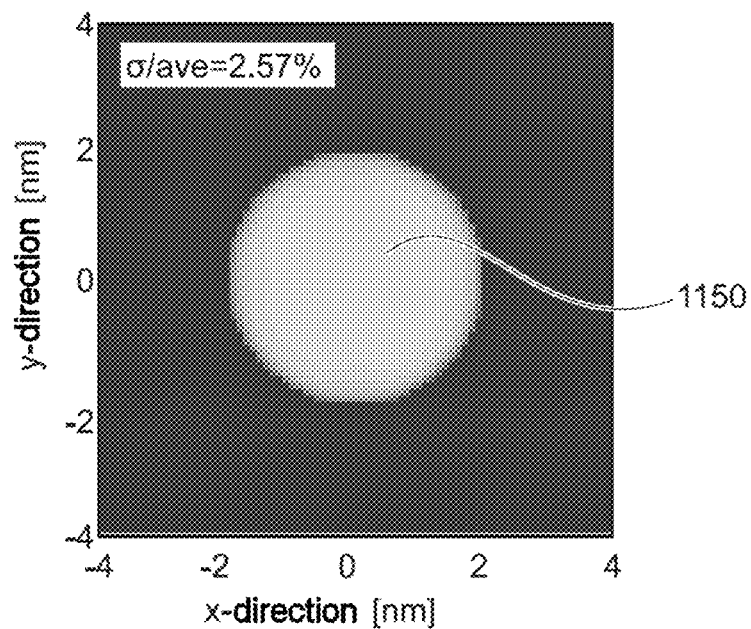
FIG. 11 schematically reproduces the kernel or the point spread function, which is generated by deconvolving the image of FIG. 9 with the reference image of FIG. 10.

FIG. 11 represents the convolution kernel 1150 or the point spread function 1150 generated from the images 900, 1000 of FIGS. 9 and 10. As is evident from the ratio of standard deviation G and mean intensity ave, the point spread function 1150 varies over the surface in the region of 2.5%. This is in conflict with the ideal point spread function 850 of FIG. 8.

Figure 12:
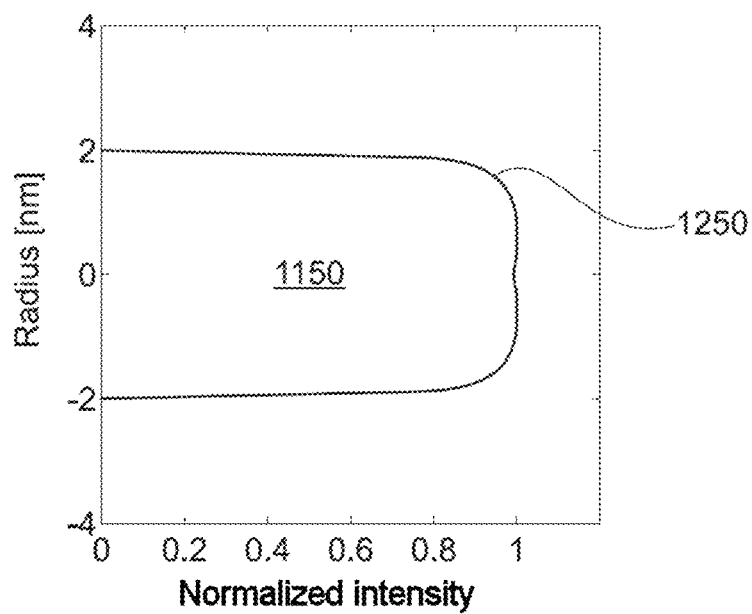
FIG. 12 reproduces a schematic section through the kernel of FIG. 11.

FIG. 12 shows a section through the point spread function 1150 of FIG. 11. Unlike what is assumed for the kernel 850 of FIG. 8, the point spread function 1150 has no plane surface. Moreover, the intensity profile of the point spread function 1150 exhibits a clearly rounded edge 1250.

Figure 13:
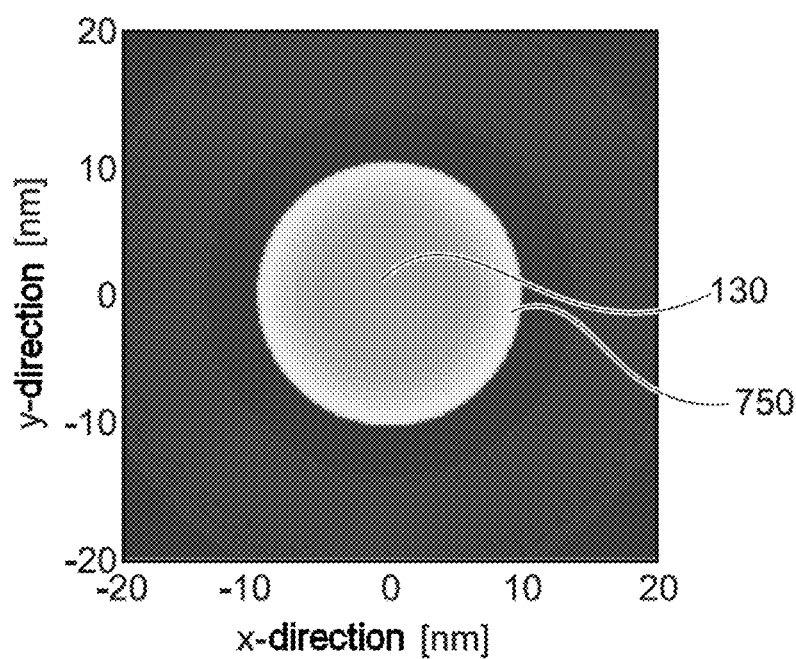
FIG. 13 reproduces FIG. 7.
Figure 14:
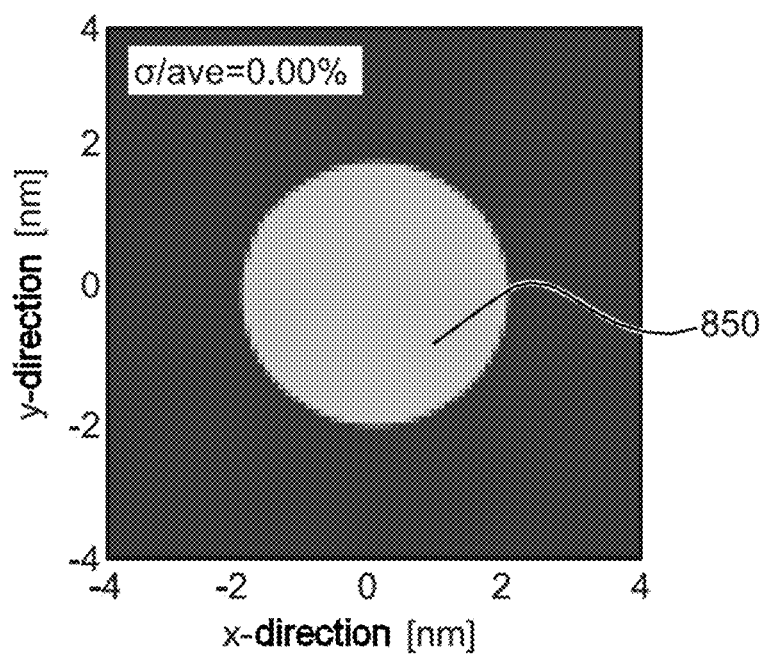
FIG. 14 repeats FIG. 8.
Figure 15:
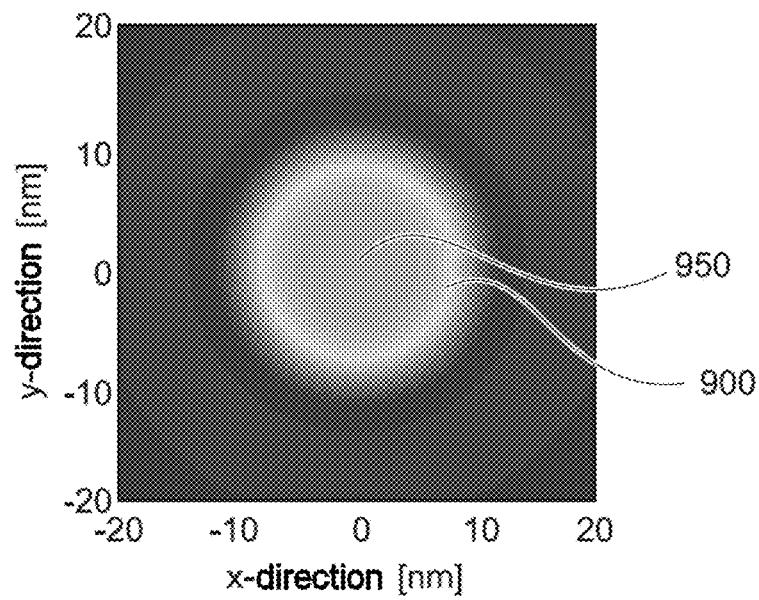
FIG. 15 reproduces FIG. 9 again.

FIGS. 13 to 18 present a second example for generating a point spread function for an electron beam 225, 510. As already mentioned above, the second example was likewise carried out on the basis of simulations. FIGS. 13, 14 and 15 of the second example correspond to FIGS. 7, 8 and 9 of the first example.

Figure 16:
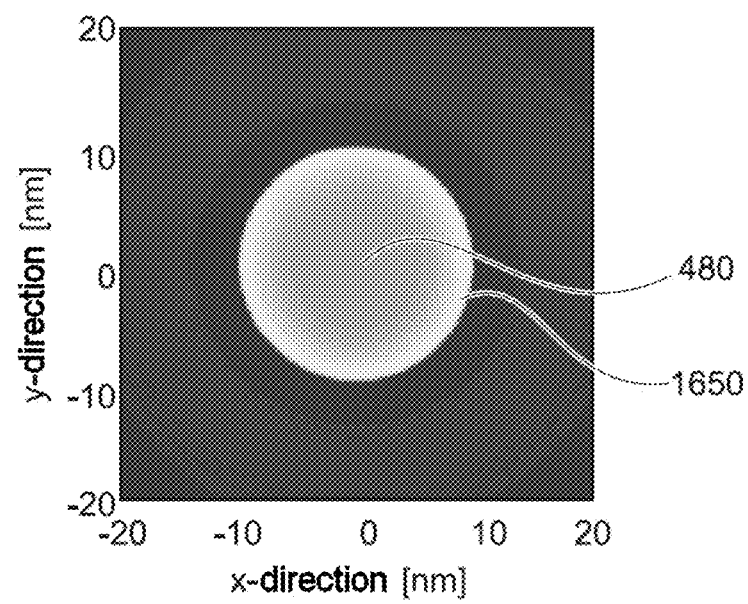
FIG. 16 represents a schematic plan view of a modified simulated reference image of the cylindrical reference structure of FIGS. 7 and 13.

Unlike in the first example, the deconvolution of the image 900 of FIG. 15 is not carried out with the reference image 450 of the cylindrical reference structure 130 of FIG. 10 in the second example of FIGS. 13 to 18. Instead, FIG. 16 presents a modified reference image 480. The modified reference image 480 takes account of the edge effect 460 when imaging or recording a reference image 450 of the cylindrical reference structure 130 by way of the electron beam 225, 510, which is represented by the kernel 850. This is visible in the modified reference image 480 by way of the bright edge 1650. Hence, the modified reference image 480 has an inhomogeneous intensity distribution over the plane surface of the cylindrical reference structure 130. Generating a modified reference image 480 from a measured reference image 450 is explained above in the context of FIG. 4.

Figure 17:
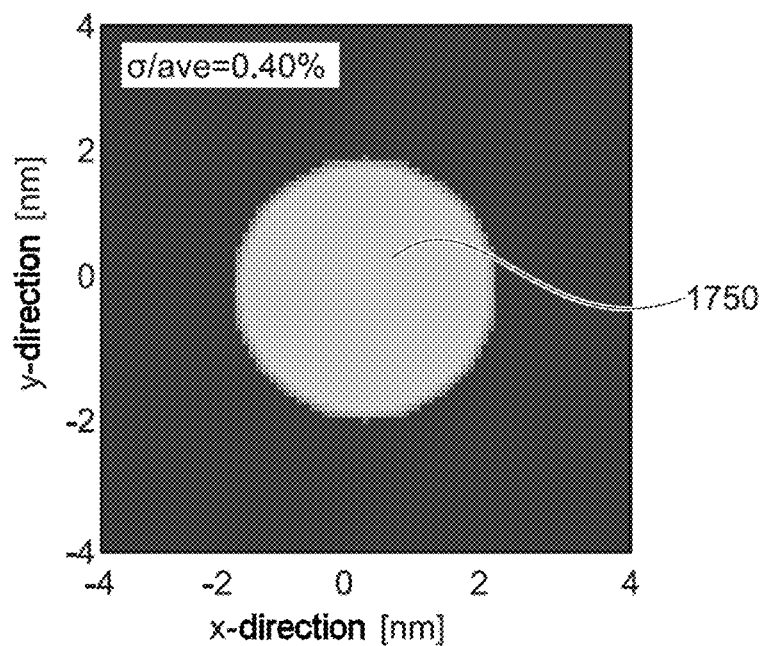
FIG. 17 schematically represents the point spread function that is generated by deconvolving the image of FIG. 15 or of FIG. 9 with the modified reference image of FIG. 16.

The modified reference image 480 is used to deconvolve the convolution kernel or generate the point spread function from the smeared convolution image 900 of FIG. 15. FIG. 17 shows the convolution kernel 1750 or the point spread function 1750 generated from the images 480, 900 of FIGS. 15 and 16. The generated convolution kernel 1750 does not reproduce the entirety of the perfect point spread function of FIG. 17. However, the deviations from the perfect convolution kernel 850, with a σ/ave-ratio of 0.4%, are better, by approximately a factor of six, than the point spread function 1150 that was generated on the basis of the reference image 450.

Figure 18:
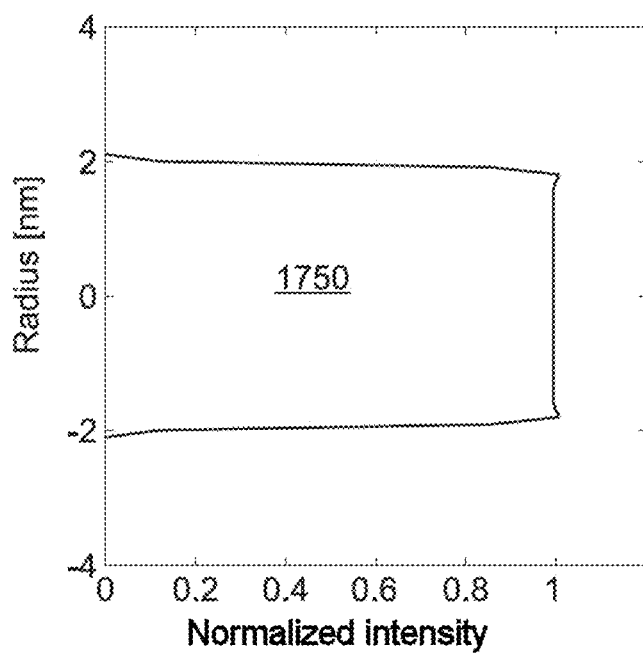
FIG. 18 presents a schematic section through the point spread function of FIG. 17.

Like FIG. 12, FIG. 18 shows a section through the point spread function 1750 of FIG. 17. The point spread function 1750 of FIG. 17 comes very close to a cylindrical intensity profile of an electron beam, as assumed in FIG. 14. Point spread functions 1750 generated as explained in the second example can be used as input quantities in a phase reconstruction process for determining the wavefront 550 of the electron beam 225, 510.

FIGS. 19 to 32 below present two examples for reconstructing a wavefront 550 of an electron beam whose wavefront is not perfect. Similar to the two examples explained above, the data discussed below were generated by use of a simulation. A phase reconstruction is additionally carried out as a further step for the two examples described below so that a deviation of the determined wavefront from a specified wavefront can be ascertained.

Figures 19, 20:
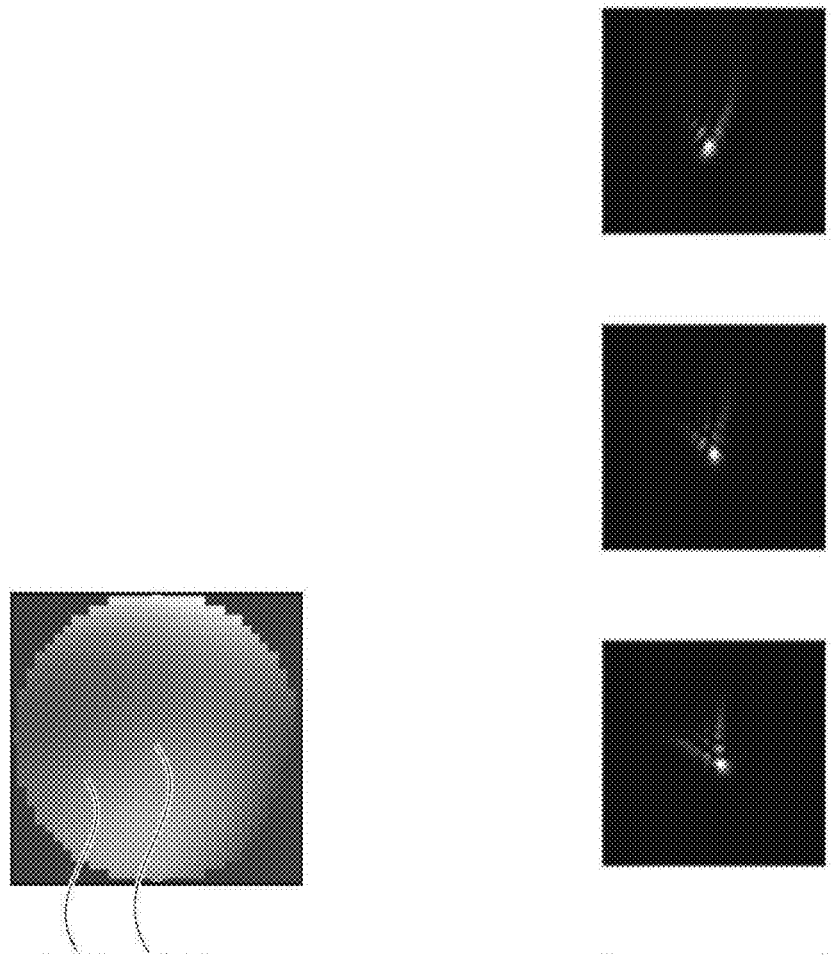
FIG. 19 shows a wavefront of an electron beam that has wavefront aberrations.
FIG. 20 presents a focus stack of the intensity profile of the electron beam of FIG. 19.

In the simulation, an electron beam with a kinetic energy of 400 eV is assumed for both of the following examples. Further, the assumption is made below that the wavefront 550 of the electron beam 1910 is subject to a random variation of half a wavelength in relation to the mean value of the wavefront (RMS, root mean square). Moreover, the following examples specify that the electron beam 1910 has a numerical aperture (NA) of 0.04 or 40 mrad. In the two examples, the reference structure 130 is embodied, once again, in the form of a cylinder, which now has a diameter of 16 nm. FIG. 19 reproduces the wavefront of the electron beam 1910, which is used in the following simulations for imaging the cylindrical reference structure 130. As already specified above, the wavefront 550 of the electron beam 1910 has a random variation of half the de Broglie wavelength. The object of the following simulations is to generate point spread functions for the electron beam 1910 from the electron beam 1910 with the wavefront aberrations 1920, said point spread functions facilitating a phase reconstruction with the smallest possible wavefront aberration.

FIG. 20 presents five intensity profiles of the electron beam 1910, which correspond to five different focus settings of the electron beam 1910. In the five images of FIG. 20, the focus, as considered from top to bottom, has the following positions in relation to the surface of the reference structure 130: −125 nm, −62.5 nm, 0 nm, 62.5 nm and 125 nm. The images of FIG. 20 show the point spread functions of the electron beam 1910 of FIG. 19, which are used as input quantities in the further simulation process. The wavefront aberrations 1920 of the electron beam 1910 of FIG. 19 clearly stand out in the focus stack of the intensity profiles.

Figure 21:
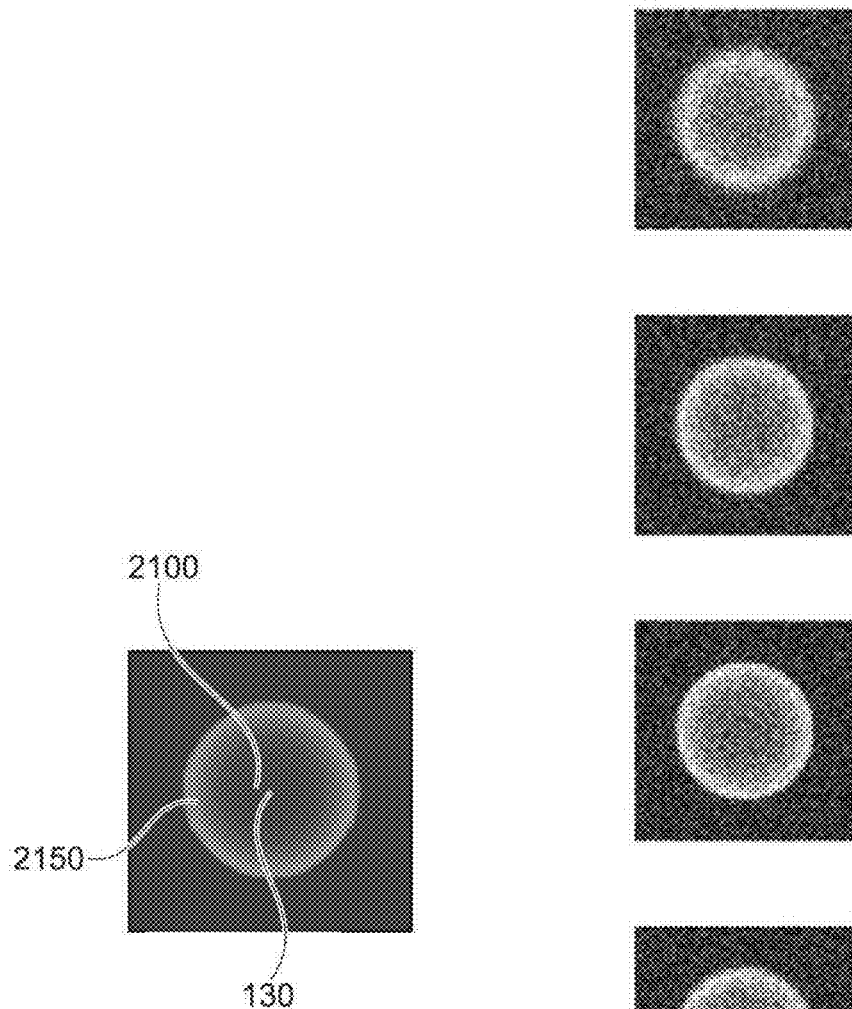
FIG. 21 reproduces a convolution kernel of a cylindrical reference element, which has a bright edge on account of the edge effect.

FIG. 21 shows a convolution kernel 2100 of the cylindrical reference structure 130. The convolution kernel 2100 of the cylindrical reference structure 130 has the edge effect 460, already described above, which stands out in the convolution kernel 2100 of the reference structure 130 by way of the bright edge 2150.

Figure 22:
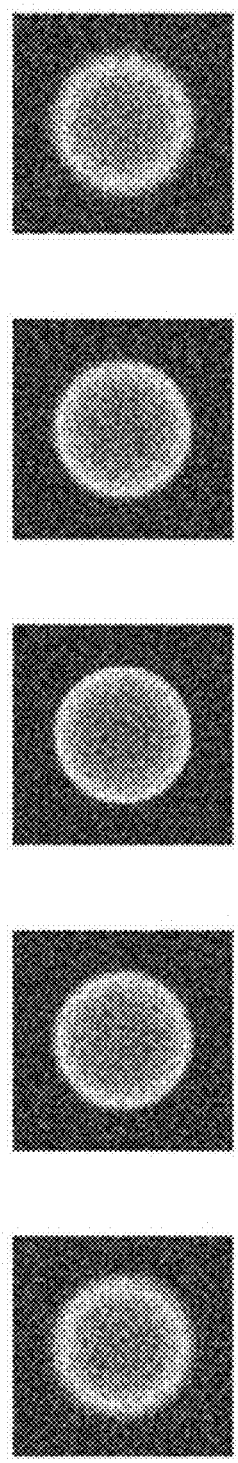
FIG. 22 reproduces images of a focus stack of a convolution of the electron beam of FIGS. 19 and 20 with the convolution kernel of FIG. 21, wherein noise was added to the images of the cylindrical reference structure.

FIG. 22 reproduces a convolution of the cylindrical reference structure 130 of FIG. 21 with the intensity profiles of the electron beam 1910, which are specified in the images of the focus stack of FIG. 20. Additionally, noise was added to the images of the reference structure 130. Consequently, the images of FIG. 22 show images of a focus stack of the reference structure 130, which the SEM 210 of the apparatus 200 would generate when scanning the reference structure 130 by the electron beam 1910 and display on the monitor 280.

Figure 23:
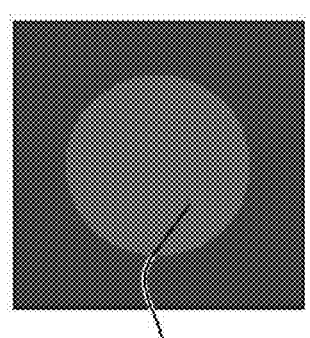
FIG. 23 shows a deconvolution kernel that does not take account of the edge effect.

FIG. 23 shows a deconvolution kernel 2350, which is used for deconvolving the images of the focus stack of the reference structure 130 of FIG. 22 in the elucidated third example. The deconvolution kernel 2350 represents an ideal image of the reference structure 130 without artefacts. This means that the reference image of the reference structure 130 in the example of FIG. 23 has no additional brightness in the region of the boundary or the edge of the cylindrical reference element.

Figure 24:
FIG. 24 reproduces the deconvolution of the images of the focus stack of the cylindrical reference structure using the deconvolution kernel of FIG. 23.
Figure 24:
Figure 24:
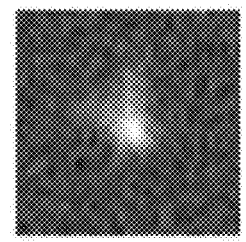
Figure 24:
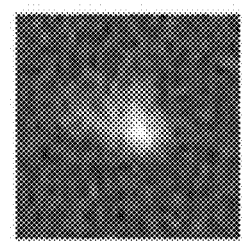
Figure 24:
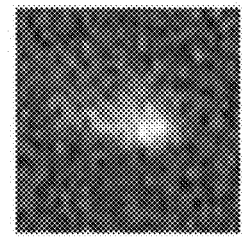

FIG. 24 reproduces the images, deconvolved with the deconvolution kernel 2350 of FIG. 23, of the images of the focus stack of the reference structure 130 of FIG. 22. A phase reconstruction is carried out in the next step. The reconstruction of the phase is implemented by varying the wavefront, which generates the focus stack of the measured images of the focus stack of FIG. 24. The images of FIG. 25 reproduce the result of the phase reconstruction carried out on the basis of the images of FIG. 24.

Figure 26:
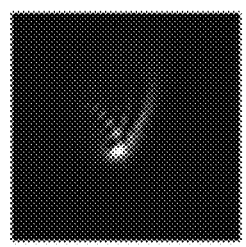
FIG. 26 illustrates the reconstructed wavefront of the electron beam of FIG. 19.
Figure 26:
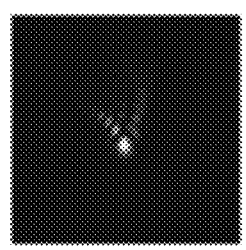
Figure 26:
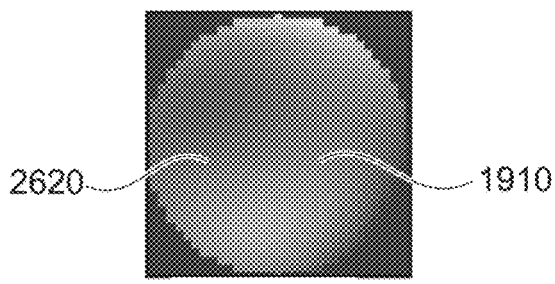
Figure 25:
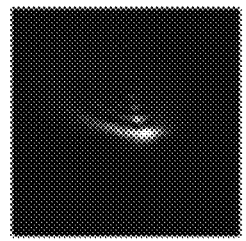
FIG. 25 presents the images of the reconstructed focus stack of FIG. 24 following the phase reconstruction.

FIG. 26 presents the reconstructed wavefront 2620 of the electron beam 1910 that comes closest to the focus stack of FIG. 25. The reconstructed wavefront 2620 of the electron beam 1910 was adapted with the aid of a least squares fit.

Figure 27:
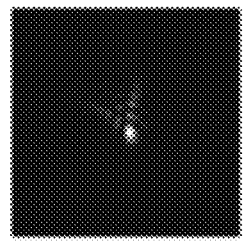
FIG. 27 reproduces the difference wavefront of FIG. 19 and the reconstructed wavefront of FIG. 26 with five-times magnification.
Figure 27:
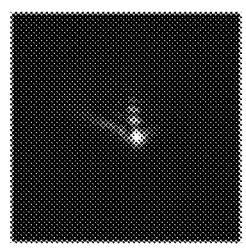
Figure 27:
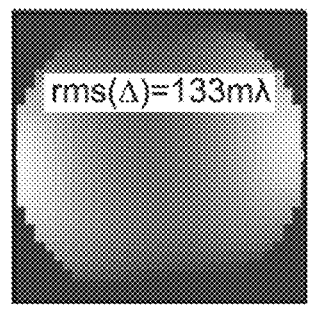

In order to check the precision of the wavefront reconstruction of the electron beam 1910, the difference between the defined wavefront 1920 of the electron beam 1910 (input or reference wavefront) and the reconstructed wavefront 2620 is formed. FIG. 27 shows the difference wavefront with a five-times magnification. The reconstructed wavefront 2620 of the electron beam 1910 has a deviation of 0.133 wavelengths in relation to a plane wavefront. The remaining wavefront aberration 2620 is mainly due to a remaining astigmatism of the electron beam 1910.

In the Marechal approximation, the input wavefront 1920 of the electron beam 1910 has a Strehl factor of: $S=\exp[-(2\pi \cdot 0.500)^2]=5.17 \cdot 10^{-5}$. In the same approximation, the reconstructed wavefront 2620 has a Strehl factor of: $S=\exp[-(2\pi \cdot 0.133)^2]=0.497$. This means that a deconvolution of the images of the focus stack of FIG. 22 with the convolution kernel 2350 of FIG. 23 leads to a significant improvement in the reconstructed wavefront of the electron beam 1910, and hence to an increase in the image quality of the images recorded therewith.

The fourth example, explained below on the basis of FIGS. 28 to 32, is based on the initial situation described on the basis of FIGS. 19 to 22. Instead of the deconvolution with the deconvolution kernel 2350 of FIG. 23, the deconvolution of the focus stack of the images of the reference structure 130 of FIG. 22 is carried out with a convolution kernel 2850 of FIG. 28, which takes account of the edge effect 460 by way of an excessive edge height 2860.

Figures 28, 29:
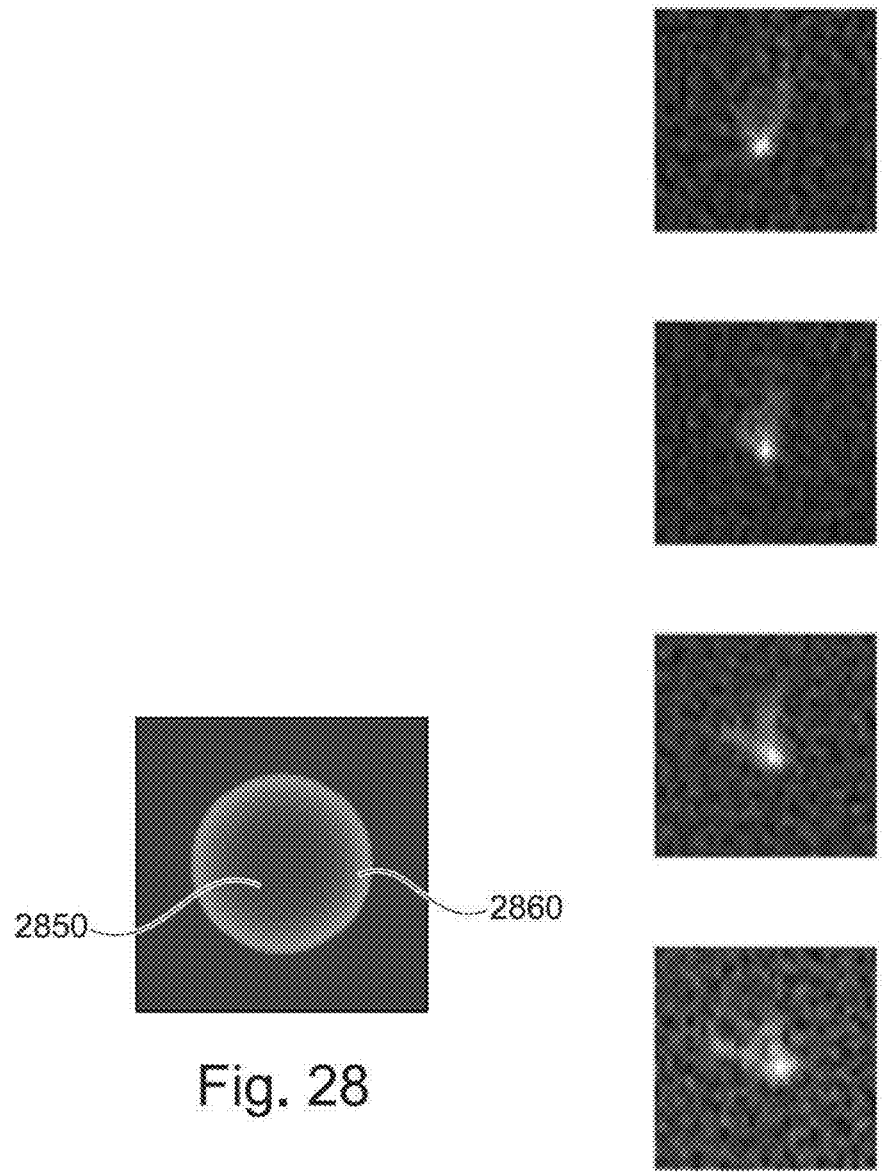
FIG. 28 shows a deconvolution kernel that takes account of the edge effect when recording the cylindrical reference structure.
FIG. 29 reproduces the deconvolution of the images of the focus stack of the cylindrical reference structure of FIG. 22 using the deconvolution kernel of FIG. 28.

FIG. 29 presents the images, deconvolved with the deconvolution kernel 2850 of FIG. 28, of the images of the focus stack of the reference structure 130 of FIG. 22.

Figure 30:
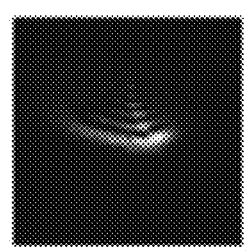
FIG. 30 presents the images of the reconstructed focus stack of FIG. 24 following the phase reconstruction.

The images of the focus stack of FIG. 30 present the focus stacks of FIG. 29 reconstructed from the images of the focus stack of the reference structure 130 of FIG. 22 by use of phase reconstruction.

Figure 31:
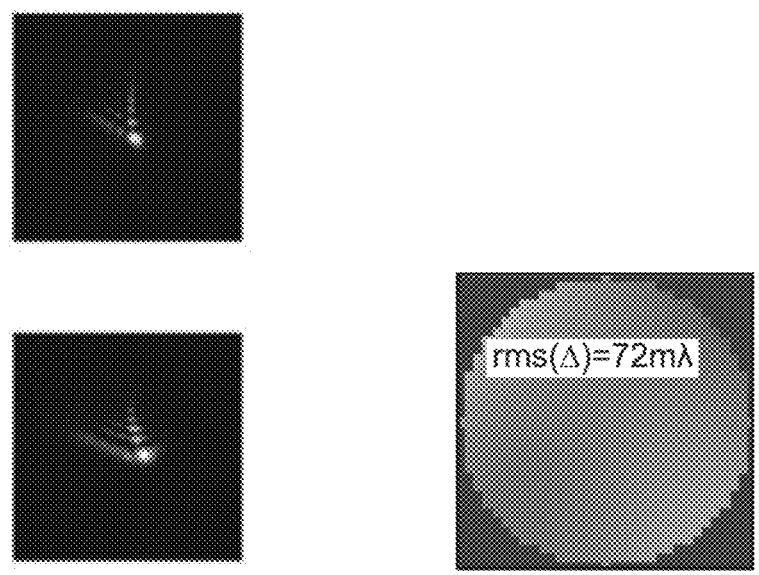
FIG. 31 illustrates the reconstructed wavefront of the electron beam of FIG. 19, which was ascertained on the basis of the point spread functions of the electron beam of FIG. 30.

Like FIG. 26, FIG. 31 shows the reconstructed wavefront 3120 of the electron beam 1910, which corresponds to a focus stack of FIG. 30 that corresponds to the measured focus stack of FIG. 29 to the best possible extent.

Figure 32:
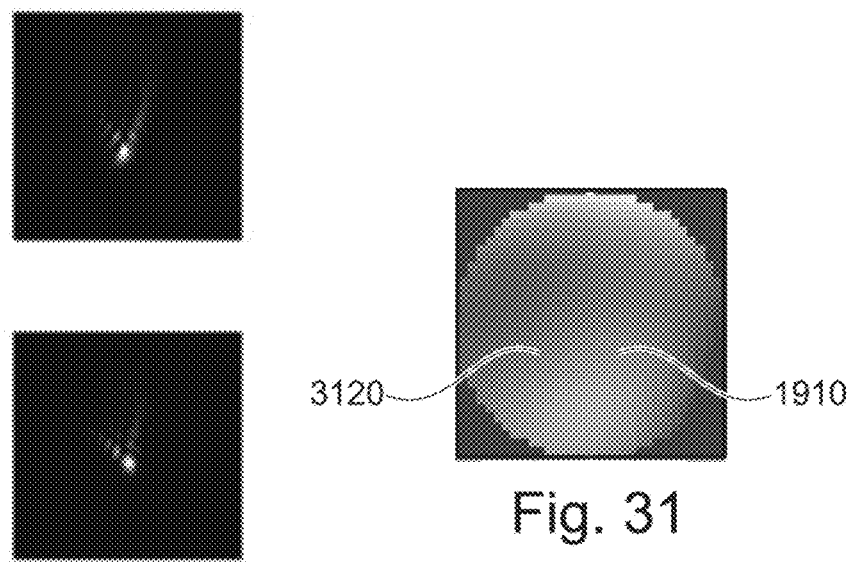
FIG. 32 shows the difference wavefront of FIG. 19 and the reconstructed wavefront of FIG. 31 with five-times magnification.

In order to check the precision of the wavefront reconstruction of the electron beam 1910, the difference between the defined wavefront 1920 of the electron beam 1910 (input or reference wavefront) and the reconstructed wavefront 2620 is formed. FIG. 32 shows the difference wavefront with a five-times magnification. The reconstructed wavefront 3120 of the electron beam 1910 has a deviation of 0.072 wavelengths in relation to a plane wavefront. The remaining wavefront aberration 3120 is again mainly due to a remaining astigmatism of the electron beam 1910.

As already explained above in the context of FIG. 27, the input wavefront 1920 of the electron beam has, in the Marechal approximation, the Strehl factor of: $S=\exp[-(2\pi \cdot 0.500)^2]=5.17 \cdot 10^{-5}$. In the same approximation, the reconstructed wavefront 2620 has a Strehl factor of: $S=\exp[-(2\pi \cdot 0.072)^2]=0.815$. By deconvolving the images of the reference structure of the focus stack of FIG. 22 with the deconvolution kernel 2850 of FIG. 28, which takes account of the edge effect 460, it is possible to once again significantly increase the image quality in comparison with FIGS. 26 and 27.

The method described in the last two examples can be carried out multiple times in succession (iteratively) in order to minimize the remaining residual error when determining the wavefront 550. When using the deconvolution kernel 2850 that takes account of the edge effect 460, the described method, which is carried out iteratively, converges to a smaller residual error in comparison with the deconvolution kernel 2350 of FIG. 23. The method explained in this application can handle noise in the recorded images of the reference structure 130. However, above a certain level of noise, the latter impairs the efficiency of the undertaken correction.

Figure 33:
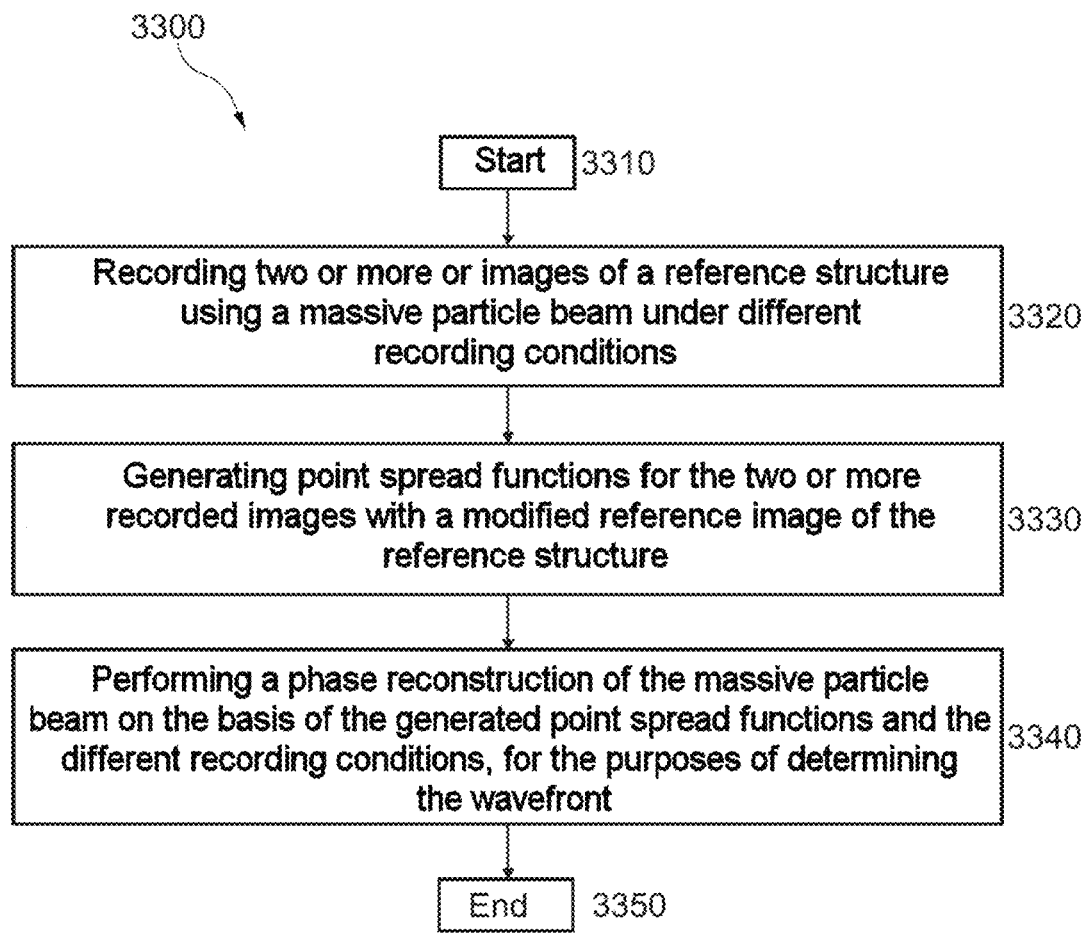
FIG. 33 specifies a flowchart of the method for determining a wavefront of a massive particle beam.

Finally, the flowchart 3300 of FIG. 33 summarizes once again essential steps of the described method for determining a wavefront 550 of a massive particle beam 225, 510, 1910. The method begins in step 3110. In the next step 3320, two or more images 310-390 of a reference structure 130 are recorded using the massive particle beam 225, 510, 1910 under different recording conditions 315, 325. The two or more images 310-390 can be part of a focus stack 300. Recording the images 310-390 can be carried out using a scanning unit 255 of the SEM 210 of the apparatus 200. The setting unit 260 can realize different recording conditions 315, 325 by adjusting the sample stage 230.

In step 3330, point spread functions 1750 for the two or more recorded images 310-390 are generated with a modified reference image 480 of the reference structure 130. A reference image 450 of the reference structure 130 can be recorded with the massive particle beam 225, 510, 1910 under the control of the scanning unit 255 of the computer system 250. Changes to be undertaken in the reference image can be determined with the aid of the simulation unit 270. The evaluation unit 265 of the computer system 250 can carry out the changes, as ascertained by the simulation unit 270, in the reference image 450 and can thereby generate a modified reference image 480. The evaluation unit 265 deconvolves the recorded images 310-390 with the modified reference image 480 in order to generate point spread functions 1750 for the images 310-390.

In step 3340, a phase reconstruction of the massive particle beam 225, 510 is performed on the basis of the generated point spread functions 1750 and the different recording conditions 315, 325, for the purposes of determining the wavefront 550. The phase reconstruction can be performed by the simulation unit 270 of the computer system 250. The method ends in step 3350.

In some implementations, the computer system 250 can include one or more data processors for processing data, one or more storage devices for storing data, such as one or more databases, and/or one or more computer programs including instructions that when executed by the computer system 250 causes the computer system 250 to carry out the computations or processes described above. In some implementations, the computer system 250 can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the computer system 250 can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the data processing (e.g., generating point spread functions, performing phase reconstructions) described above can be implemented using software for execution on one or more mobile computing devices, one or more local computing devices, one or more remote computing devices, and/or one or more cloud computing servers. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a CD-ROM, DVD-ROM, Blu-ray disc, hard drive, or flash drive, readable by a general or special purpose programmable computer or delivered (encoded in a propagated signal) over a network to the computer where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

While this specification contains many implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. The separation of various system components in the embodiments described above should not be understood as requiring such separation in all embodiments. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. In addition, the actions recited in the claims can be performed in a different order and still achieve desirable results.

What is claimed is:

1. A method for determining a wavefront of a massive particle beam, said method including the steps of:
   a. recording two or more images of a reference structure using the massive particle beam under different recording conditions;
   b. generating point spread functions for the two or more recorded images with a modified reference image of the reference structure; and
   c. performing a phase reconstruction of the massive particle beam on the basis of the generated point spread functions and the different recording conditions, for the purposes of determining the wavefront.

2. The method of claim 1, wherein the different recording conditions comprise different parameter settings of a source and/or of an imaging system of the massive particle beam and/or different parameter settings of a detection apparatus for recording the images.

3. The method of claim 1, wherein the different recording conditions comprise different focus settings of the massive particle beam when recording the two or more images.

4. The method of claim 1, wherein a reference image of the reference structure represents at least one recording of the reference structure using the massive particle beam, in which the reference structure is arranged in the focus of the massive particle beam.

5. The method of claim 1, wherein a modified reference image of the reference structure substantially corrects artefacts when recording the two or more images of the reference structure.

6. The method of claim 5, wherein artefacts are caused by: electrostatic charging of the reference structure by the massive particle beam and/or at least one edge effect of at least one edge of the reference structure in the two or more recorded images when imaging the reference structure using the massive particle beam.

7. The method of claim 5, wherein correcting the at least one artefact comprises: determining an effect of electrostatic charging of the reference structure and/or of the at least one edge effect in the two or more recorded images.

8. The method of claim 7, wherein determining the effect of the electrostatic charging of the reference structure and/or of the at least one edge effect comprises: simulating the electrostatic charging of the reference structure and/or the at least one edge effect.

9. The method of claim 5, wherein correcting the at least one artefact comprises modifying the reference image of the reference structure.

10. The method of claim 1, wherein generating point spread functions comprises: deconvolving the two or more recorded images with the modified reference image of the reference structure.

11. The method of claim 1, wherein the modified reference image corresponds to a non-modified reference image.

12. The method of claim 1, further including the step of: providing the reference structure and/or characterizing the reference structure using the massive particle beam.

13. The method of claim 1, wherein the reference structure comprises at least one needle-shaped material arrangement, which is arranged on a substrate, and wherein the needle-shaped material arrangement and the substrate have different material compositions.

14. The method of claim 1, wherein the reference structure comprises at least one sharp edge and/or at least one defined side wall angle.

15. The method of claim 1, wherein generating a modified reference image comprises: recording two or more reference images at different kinetic energies of the massive particle beam under the best-possible recording conditions and replacing the modified reference image by a combination of reference images recorded at different energies.

16. The method of claim 1, further including the step of: modifying the determined wavefront of the massive particle beam so that the altered wavefront substantially corresponds to a specified wavefront.

17. An apparatus for determining a wavefront of a massive particle beam, comprising:
   a. means for recording two or more images of a reference structure using the massive particle beam under different recording conditions; and
   b. one or more computing devices and one or more storage devices comprising first stored instructions that when executed by the one or more computing devices cause the one or more computing devices to perform the function of generating point spread functions for the two or more recorded images with a modified reference image of the reference structure,
   c. wherein the one or more storage devices further comprise second stored instructions that when executed by the one or more computing devices cause the one or more computing devices to perform the function of performing a phase reconstruction of the massive particle beam on the basis of the generated point spread functions and the different recording conditions, for the purposes of determining the wavefront.

18. A computer program comprising instructions that prompt a computer system of the apparatus of claim 17 to carry out the method steps of claim 1 when the computer system executes the computer program.

19. The apparatus of claim 17, wherein the means for recording two or more images of a reference structure is configured to record a reference image of the reference structure.

20. The apparatus of claim 17, wherein the apparatus comprises a setting unit configured to set and control parameters for adapting a determined wavefront of the massive particle beam to a specified wavefront.

* * * * *

UNITED STATES PATENT AND TRADEMARK OFFICE
CERTIFICATE OF CORRECTION

PATENT NO. : 11,355,311 B2
APPLICATION NO. : 16/832471
DATED : June 7, 2022
INVENTOR(S) : Joachim Welte and Markus Bauer It is certified that error appears in the above-identified patent and that said Letters Patent is hereby corrected as shown below:

In the Specification

Column 8
Line 58, delete "$\lambda$," and insert -- $\lambda$ --.

Column 10
Line 42, delete "$R_{total}^2 = R_D^2 R_I^2 + R_C^2 + R_S^2$" and insert -- $R_{total}^2 = R_D^2 + R_I^2 + R_C^2 + R_S^2$ --.

Column 16
Line 46, delete "standard deviation G" and insert -- standard deviation $\sigma$ --.

Signed and Sealed this
Thirtieth Day of August, 2022

Katherine Kelly Vidal
*Director of the United States Patent and Trademark Office*